(12) United States Patent
Liaw

(10) Patent No.: US 9,812,459 B2
(45) Date of Patent: Nov. 7, 2017

(54) EMBEDDED SRAM AND METHODS OF FORMING THE SAME

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/046,150

(22) Filed: Feb. 17, 2016

(65) Prior Publication Data

US 2016/0163717 A1 Jun. 9, 2016

Related U.S. Application Data

(62) Division of application No. 13/922,097, filed on Jun. 19, 2013, now Pat. No. 9,293,466.

(51) Int. Cl.
*H01L 27/11* (2006.01)
*H01L 29/32* (2006.01)
(Continued)

(52) U.S. Cl.
CPC ........ *H01L 27/1104* (2013.01); *G11C 11/412* (2013.01); *H01L 21/266* (2013.01); *H01L 21/26506* (2013.01); *H01L 21/324* (2013.01); *H01L 21/76224* (2013.01); *H01L 27/0886* (2013.01); *H01L 27/1116* (2013.01); *H01L 29/0649* (2013.01); *H01L 29/0847* (2013.01); *H01L 29/161* (2013.01); *H01L 29/167* (2013.01); *H01L 29/1608* (2013.01);
(Continued)

(58) Field of Classification Search
CPC ............. G11C 11/412; H01L 21/26506; H01L 21/266; H01L 21/324; H01L 21/76224
See application file for complete search history.

(56) References Cited

U.S. PATENT DOCUMENTS 6,921,982 B2 7/2005 Joshi et al.
8,015,514 B2 9/2011 Jaffe et al.
(Continued)

FOREIGN PATENT DOCUMENTS

KR        101354660 B1    3/2008
KR     1020080073352 A    8/2008
KR        101378987 B1    9/2009

OTHER PUBLICATIONS

Figielski, "Dislocations in Semiconductor Materials and Devices," Acta Physica Hungarica, vol. 56, pp. 119-130, 1984.

*Primary Examiner* — Bilkis Jahan
*Assistant Examiner* — Victor Barzykin
(74) *Attorney, Agent, or Firm* — Slater Matsil, LLP

(57) ABSTRACT

A chip includes a semiconductor substrate, and a first N-type Metal Oxide Semiconductor Field Effect Transistor (NMOSFET) at a surface of the semiconductor substrate. The first NMOSFET includes a gate stack over the semiconductor substrate, a source/drain region adjacent to the gate stack, and a dislocation plane having a portion in the source/drain region. The chip further includes a second NMOSFET at the surface of the semiconductor substrate, wherein the second NMOSFET is free from dislocation planes.

20 Claims, 20 Drawing Sheets

(51) Int. Cl.

| | |
|---|---|
| *G11C 11/412* | (2006.01) |
| *H01L 29/78* | (2006.01) |
| *H01L 29/66* | (2006.01) |
| *H01L 27/088* | (2006.01) |
| *H01L 21/265* | (2006.01) |
| *H01L 21/266* | (2006.01) |
| *H01L 21/324* | (2006.01) |
| *H01L 21/762* | (2006.01) |
| *H01L 29/06* | (2006.01) |
| *H01L 29/08* | (2006.01) |
| *H01L 29/16* | (2006.01) |
| *H01L 29/161* | (2006.01) |
| *H01L 29/167* | (2006.01) |

(52) U.S. Cl.
CPC ........ *H01L 29/32* (2013.01); *H01L 29/66545* (2013.01); *H01L 29/66636* (2013.01); *H01L 29/66795* (2013.01); *H01L 29/785* (2013.01); *H01L 29/7843* (2013.01); *H01L 29/7847* (2013.01)

(56) References Cited

U.S. PATENT DOCUMENTS

| | | | |
|---|---|---|---|
| 8,193,049 B2 | 6/2012 | Golonzka et al. | |
| 2007/0123010 A1 | 5/2007 | Hoentschel et al. | |
| 2008/0057636 A1 | 3/2008 | Lindsay et al. | |
| 2009/0109732 A1* | 4/2009 | Houston | G11C 11/412 365/154 |
| 2009/0221115 A1* | 9/2009 | Scott | H01L 21/26506 438/199 |
| 2009/0325358 A1* | 12/2009 | Koester | H01L 21/26506 438/306 |
| 2010/0148270 A1 | 6/2010 | Golonzka et al. | |
| 2010/0164013 A1* | 7/2010 | Jaffe | G06F 17/5068 257/390 |
| 2011/0104878 A1 | 5/2011 | Beyer et al. | |
| 2011/0317485 A1* | 12/2011 | Liaw | H01L 27/11 365/182 |
| 2012/0286375 A1* | 11/2012 | Cai | H01L 21/823412 257/412 |
| 2013/0099294 A1* | 4/2013 | Lu | H01L 21/76232 257/288 |
| 2013/0146949 A1* | 6/2013 | Tsai | H01L 21/26506 257/288 |

* cited by examiner

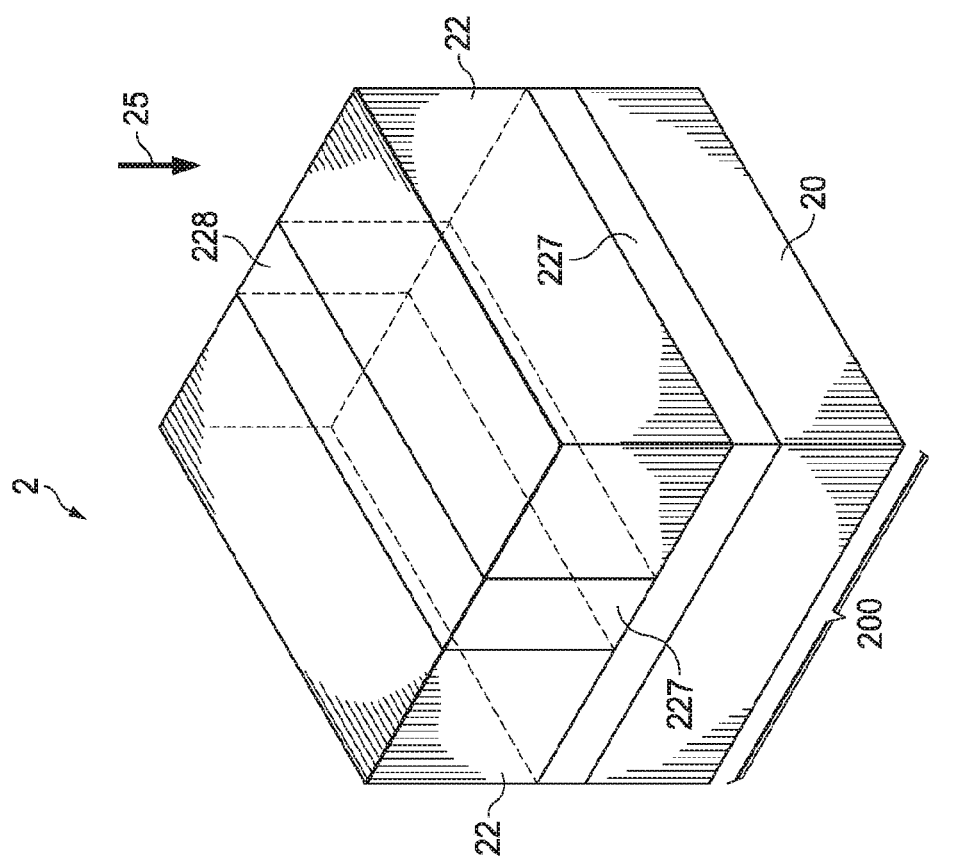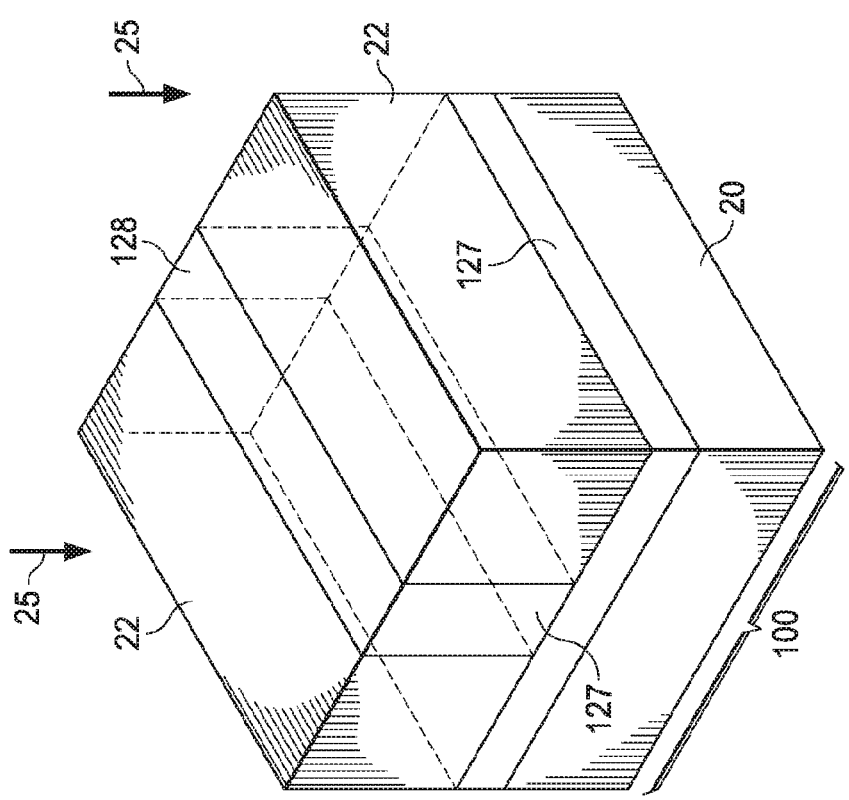
FIG. 4

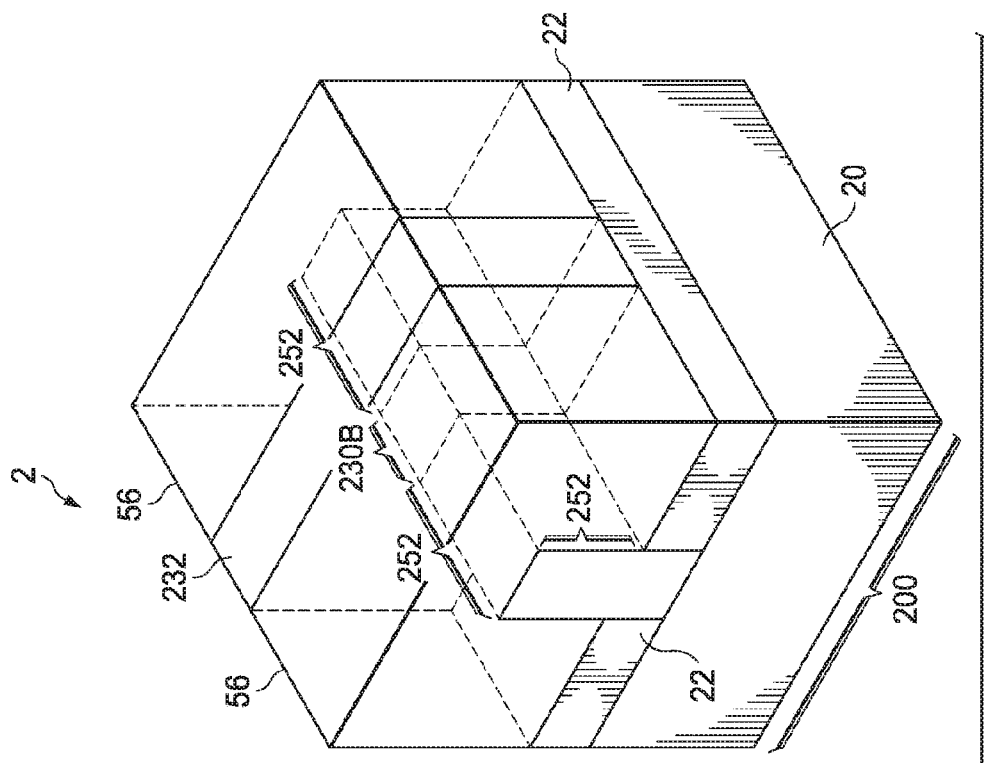
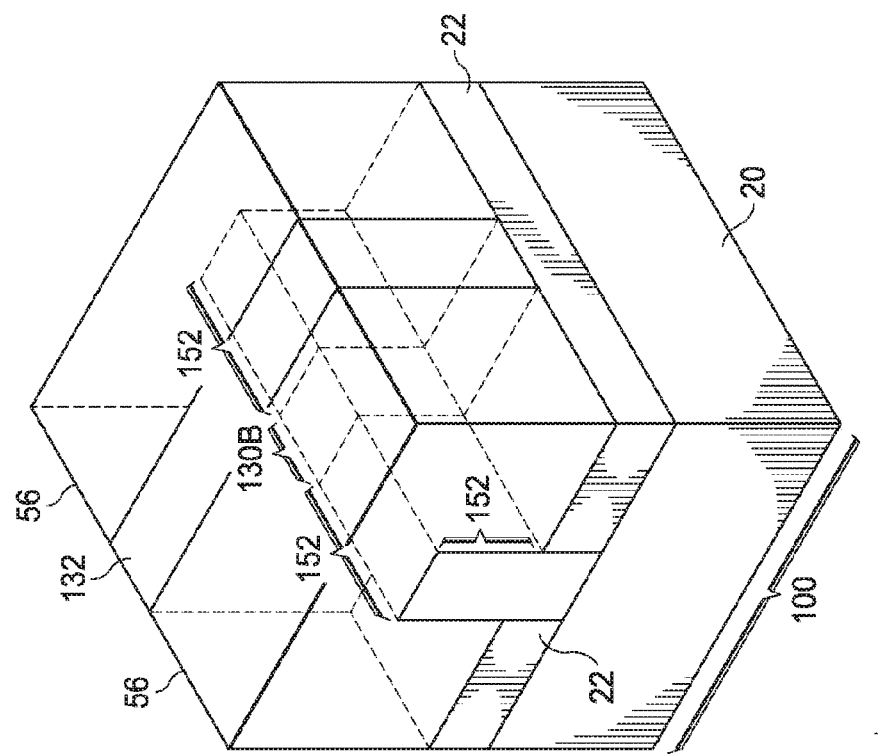
FIG. 13

EMBEDDED SRAM AND METHODS OF FORMING THE SAME

This application is a divisional of U.S. patent application Ser. No. 13/922,097, entitled "Embedded SRAM and Method of Forming the Same," filed on Jun. 19, 2013, which application is hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. Furthermore, enough read margin and write margins are required to achieve reliable read and write operations, respectively. With the increasingly scaling down of the already very small SRAM cells, however, such request becomes increasingly demanding.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 15 are cross-sectional views of intermediate stages in the manufacturing of a first Fin Field-Effect Transistor (FinFET) with dislocation planes and a second FinFET without dislocation planes on a same chip in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Transistors with multiple threshold voltages and the method of forming the same are provided in accordance with various exemplary embodiments. The intermediate stages of forming the transistors are illustrated. The variations of the embodiments are discussed. Throughout the various views and illustrative embodiments, like reference numbers are used to designate like elements.

Figure 1:
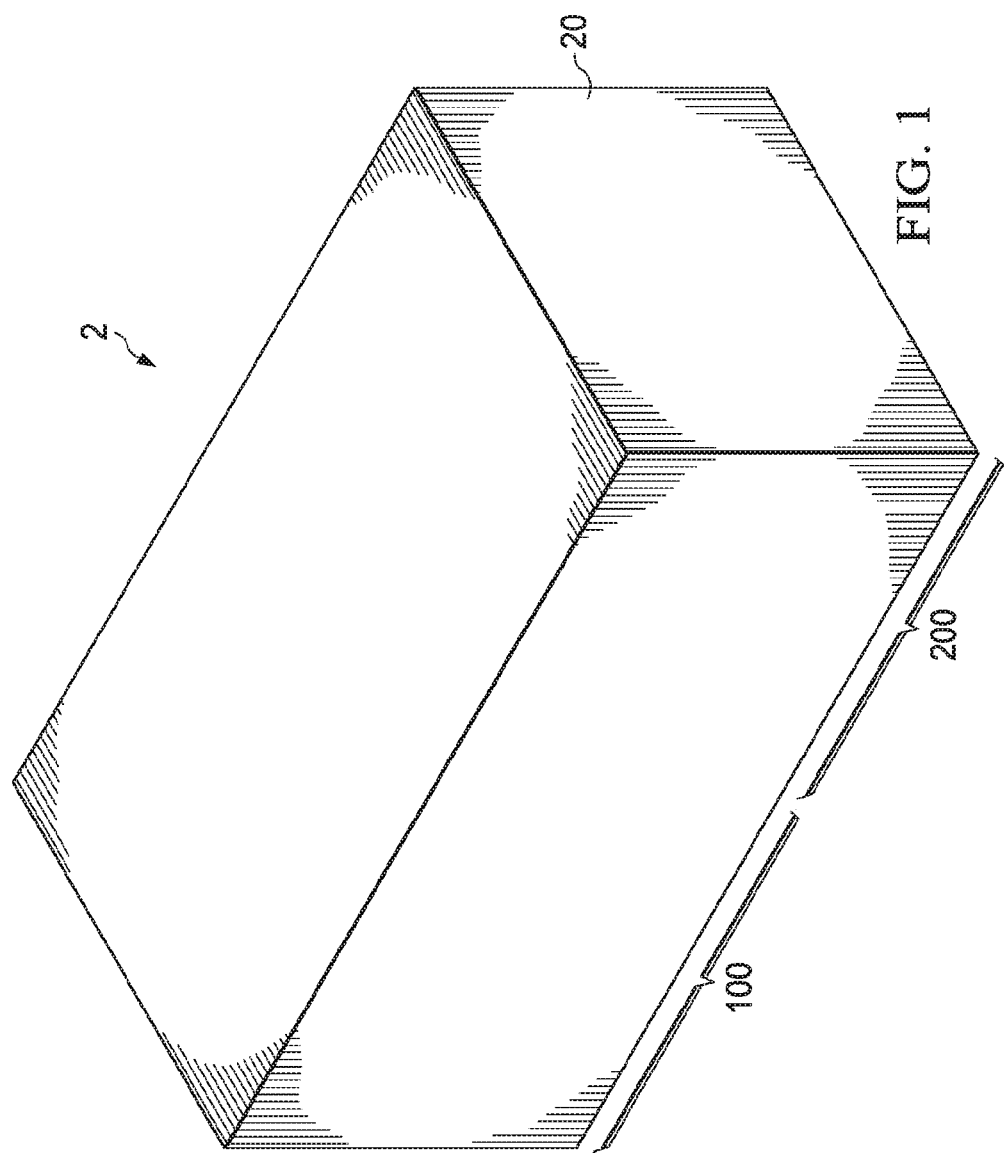

FIGS. 1 through 15 are cross-sectional views and perspective views of intermediate stages in the manufacturing of FinFETs 100' and 200' (FIG. 15) in accordance with some exemplary embodiments. FIG. 1 illustrates a perspective view of substrate 20, which is a part of chip 2 in a wafer. Substrate 20 may be a semiconductor substrate, which may further be a silicon substrate, a silicon carbon substrate, or a substrate formed of other semiconductor materials. Substrate 20 may be lightly doped with a p-type or an n-type impurity. Substrate 20 includes a first portion in region 100, and a second portion in region 200. Although the portion of substrate 20 between the first portion and the second portion of substrate 20 is not shown in some figures, the first and the second portions belong to a continuous substrate 20 and the same chip 2. In the subsequently discussed examples, FinFETs 100' and 200' (FIG. 15) are n-type FinFETs. The teaching provided in the present disclosure, however, is readily applicable for the formation of p-type FinFETs (and planar n-type and p-type transistors), with the conductivity types of the respective well regions, source and drain regions, etc. inverted.

Regions 100 and 200 may be of different types, and are referred to in accordance with the types of devices formed therein. In some embodiments, region 100 is a logic device region for forming logic transistors therein. The logic device region does not include any memory array therein, and may be, or may not be, in the peripheral region of SRAM arrays. For example, the logic device may be in the driver circuit or the decoder circuit of the SRAM arrays. Region 200 is a Static Random Access Memory (SRAM) region, in which SRAM cells and transistors are formed. Furthermore, region 200 may include both PMOS and NMOS devices therein, and hence FinFET 200' (FIG. 15) may represent a SRAM NMOS device and/or a PMOS device. In alternative embodiments, region 100 is a multi-fin FinFET region and region 200 is a single-fin FinFET region, with the FinFET in region 100 comprising a plurality of fins, while the FinFETs in region 200 may be single-fin FinFETs with each having a single fin. In yet alternative embodiments, region 100 is a read-port transistor region of a two-port SRAM cell, and region 200 is a write-port transistor region of the same two-port SRAM cell. Furthermore, regions 100 and 200 may be planar devices regions including planar transistors or FinFET regions in some embodiments.

Figure 2:
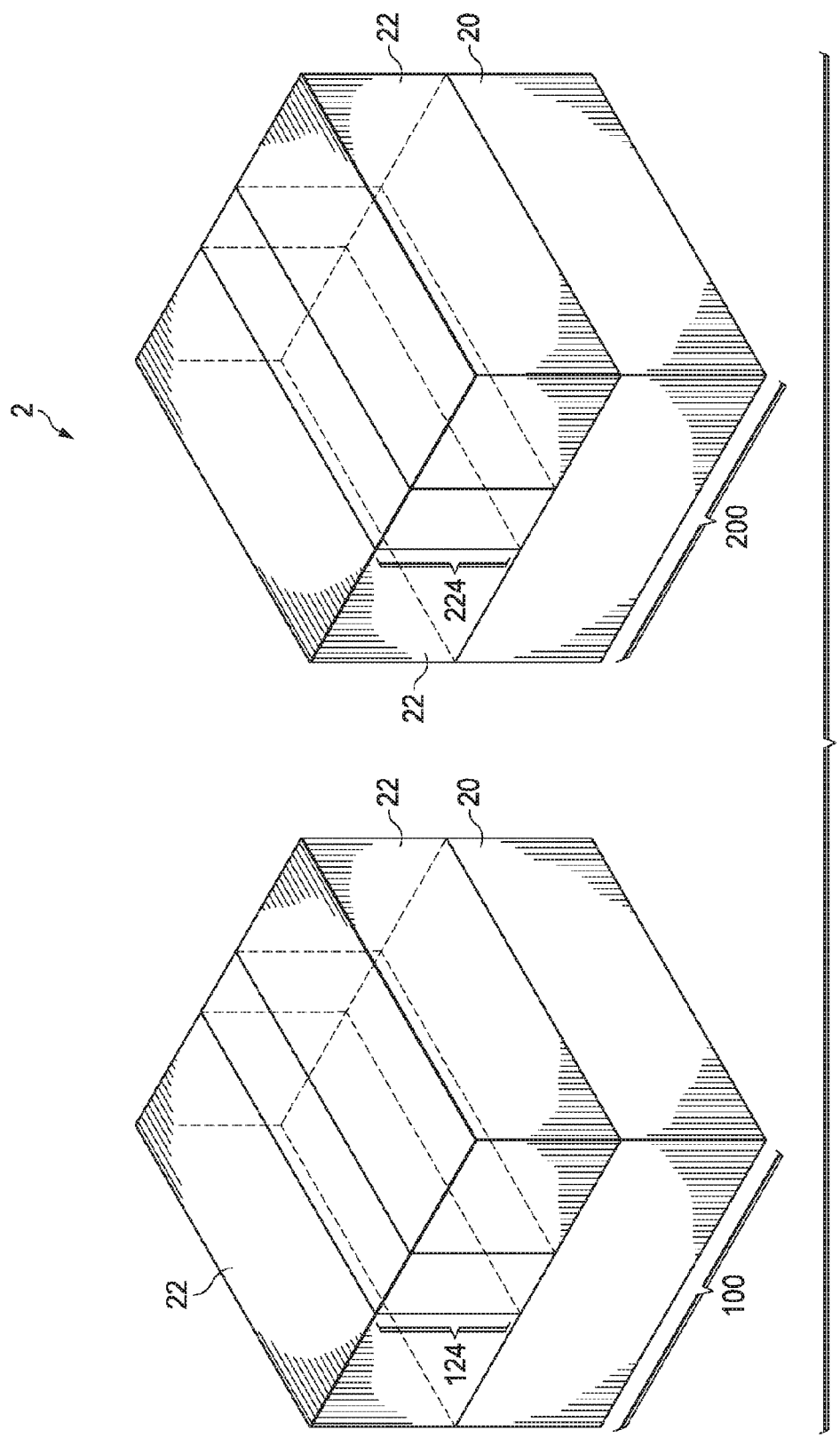

Next, referring to FIG. 2, isolation regions 22 are formed, which extend from a top surface of substrate 20 into substrate 20. Isolation regions 22 may be Shallow Trench Isolation (STI) regions, and are referred to as STI region 22 hereinafter. The formation of STI regions 22 may include etching semiconductor substrate 20 to form trenches (not shown), and filling the trenches with a dielectric material to form STI regions 22. STI regions 22 may comprise silicon oxide, for example, although other dielectric materials may also be used. The portions of substrate 20 between neighboring STI regions 22 are referred to as semiconductor strips 124 and 224 throughout the description. Semiconductor strips 124 and 224 are in regions 100 and 200, respectively. The top surfaces of semiconductor strips 124 and 224 and the top surfaces of STI regions 22 may be substantially level with each other, although they may be at slightly different levels.

Figure 3:
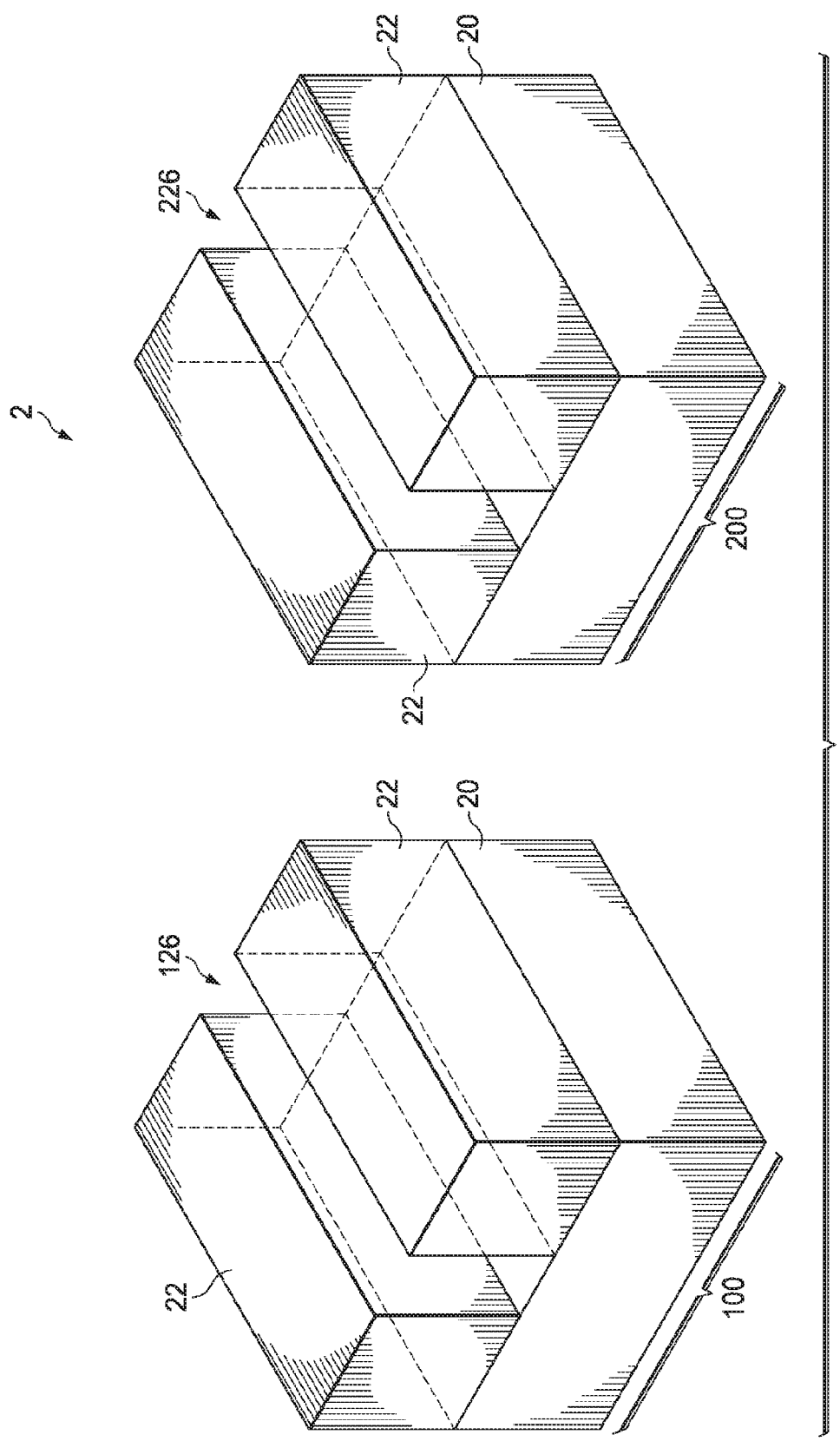

In accordance with some exemplary embodiments, the steps shown in FIGS. 3 and 4 are performed to replace the materials of semiconductor strips 124 and 224 in order to form semiconductor strips 128 and 228. In alternative embodiments, the replacement steps are not performed. Referring to FIG. 3, at least top portions of, or substantially entireties of, semiconductor strips 124 and 224 in FIG. 2 are removed. Accordingly, recesses 126 and 226 are formed between STI regions 22. The bottom surfaces of recesses 126 and 226 may be level with the bottom surfaces of STI regions 22. Alternatively, the bottom surfaces of recesses 126 and 226 are higher than or lower than the bottom surfaces of STI regions 22.

An epitaxy is performed to grow a semiconductor material in recesses 126 and 226. The resulting structure is shown in FIG. 4, wherein the epitaxy semiconductor forms semiconductor strips 128 and 228 in regions 100 and 200, respectively. A Chemical Mechanical Polish (CMP) is then performed to level the top surfaces of semiconductor strips 128 and 228 with the top surfaces of STI regions 22. Semiconductor strips 128 and 228 may have a lattice constant greater than, substantially equal to, or smaller than, the lattice constant of substrate 20. Furthermore, semiconductor strips 128 and 228 may comprise silicon germanium, silicon carbon, pure or substantially pure germanium, a III-V compound semiconductor, a II-VI compound semiconductor, or the like. For example, the available materials for forming III-V compound semiconductor strips 128 and 228 include, but are not limited to, InAs, AlAs, GaAs, InP, GaN, InGaAs, InAlAs, GaSb, AlSb, AlP, GaP, and the like.

In some embodiments, after the epitaxy and the CMP, an implantation step 25 is performed, which step is referred to as a well doping step. As a result, well regions 127 and 227 are formed in regions 100 and 200, respectively. The bottom surfaces of well regions 127 and 227 may be lower than, although they may also be level with or higher than, the bottom surfaces of STI regions 22. In some embodiments, the well doping is performed by implanting a p-type impurity, such as boron, indium, or the like. The dosage for implanting well regions 127 and 227 may be between about $1E12/cm^2$ and about $5E14/cm^2$, for example. In alternative embodiments, semiconductor strips 128 and 228 are in-situ doped during the epitaxy to receive the well doping.

In alternative embodiments, the process steps in FIGS. 3 and 4 are skipped, and semiconductor strips 124 and 224 in FIG. 2 remain not replaced. In which embodiments, semiconductor strips 124 and 224 in FIG. 2 are also referred to as semiconductor strips 128 and 228, respectively, in subsequent discussion. Semiconductor strips 128 and 228 in accordance with these embodiments are formed of the same semiconductor material as semiconductor substrate 20. Furthermore, in these embodiments, implantation step 25 is also performed to form well regions 127 and 227.

Figure 5:
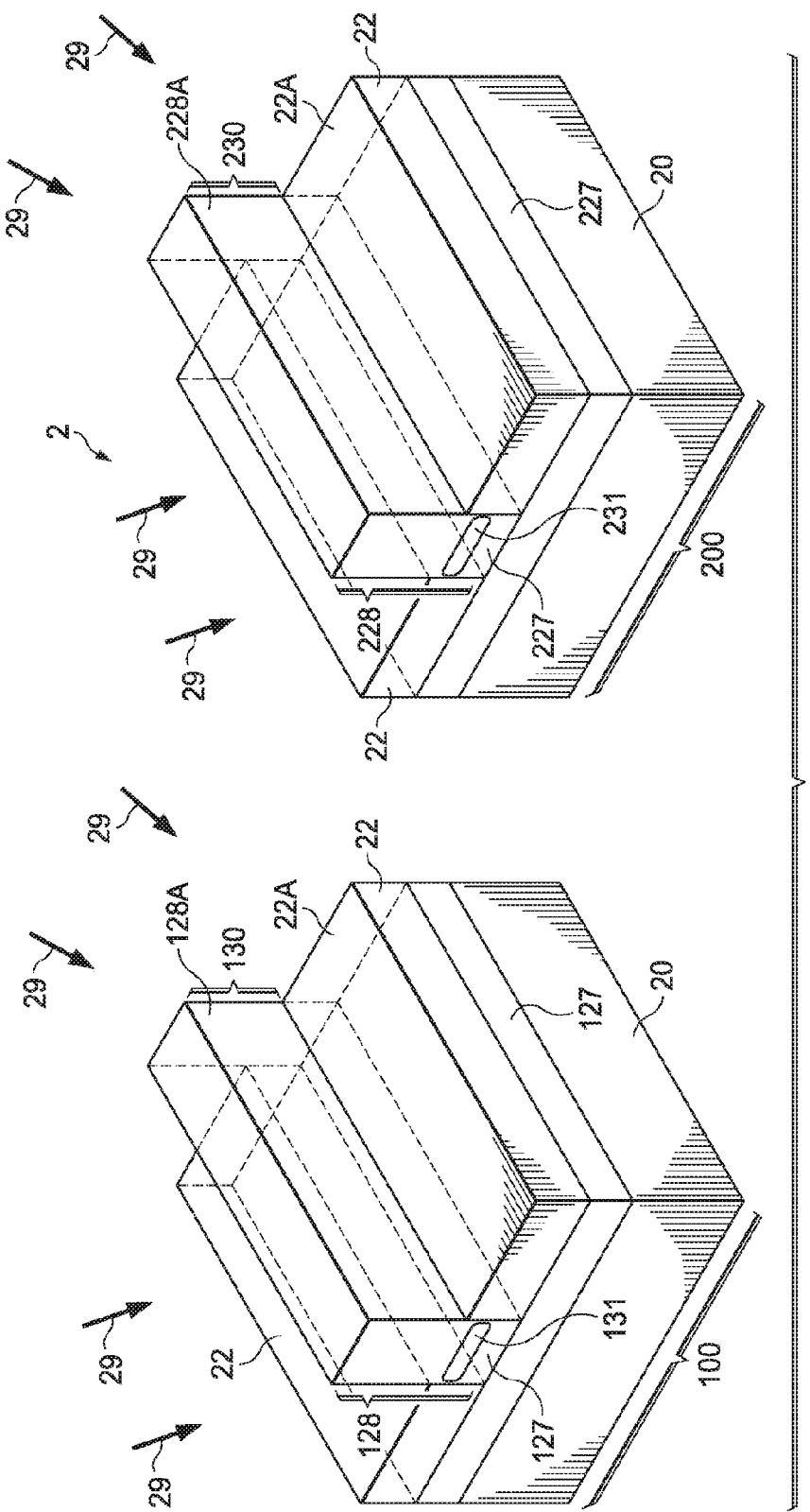

Referring to FIG. 5, STI regions 22 are recessed, for example, through an etching step. The top surfaces 22A of the remaining STI regions 22 are thus lower than top surface 128A and 228A of semiconductor strips 128 and 228, respectively. Throughout the description, the portions of semiconductor strips 128 and 228 over top surface 22A are referred to as semiconductor fins 130 and 230, respectively. Semiconductor fins 130 and 230 are also referred to as the active regions for forming the resulting FinFETs.

In accordance with some embodiments, an additional p-type implantation step 29 is performed, which may include tilt implantations from the opposite sides of semiconductor fins 130 and 230. As a result, Anti-Punch-Through (APT) regions 131 and 231 are formed. APT regions 131 and 231 have higher p-type impurity concentrations than the lower portions of semiconductor strips 128 and 228. APT regions 131 and 231 are in semiconductor strips 128 and 228, and extend to the positions slightly lower than the top surfaces of STI regions 22. In alternative embodiments, the formation of APT regions 131 and 231 is skipped. For clarity, in subsequent drawings, APT regions 131 and 231 are not illustrated.

Figure 6:
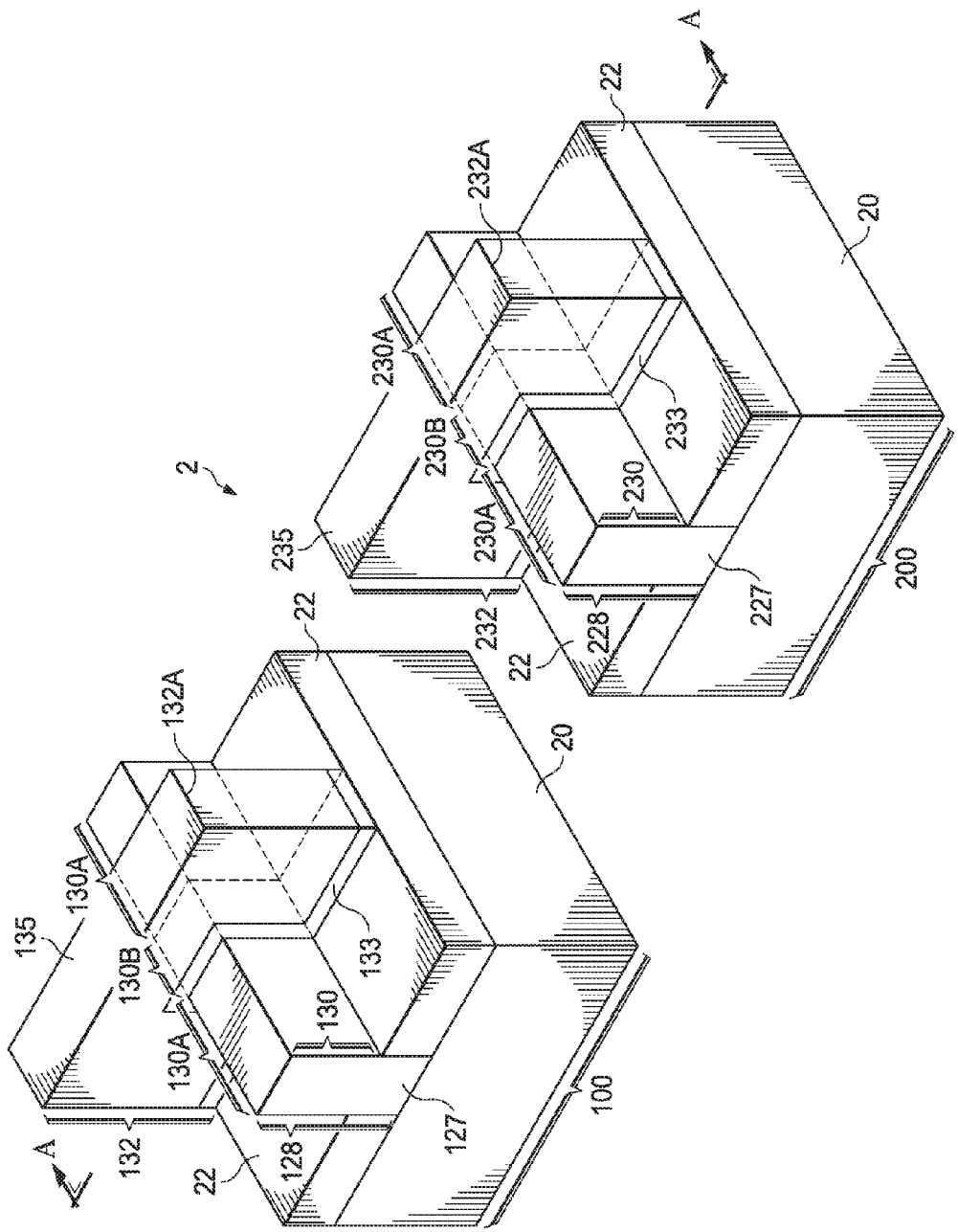

Referring to FIG. 6, dummy gate stacks 132 and 232 are formed. In some embodiments, dummy gate stacks 132 and 232 include dummy gate electrodes 135 and 235 and the underlying dummy gate dielectrics 133 and 233. Dummy gate electrodes 135 and 235 may comprise, for example, polysilicon. The formation of dummy gate stacks 132 and 232 may include forming blank layer(s), performing a CMP to level the top surface of the blank layer(s), and patterning the blank layers. The remaining portions of the blank layers(s) are dummy gate stacks 132 and 232. Dummy gate stacks 132 and 232 cover middle portions 130B and 230B of semiconductor fins 130 and 230, respectively. Opposite end portions 130A and 230A of semiconductor fins 130 and 230 are not covered. Dummy gate stacks 132 and 232 may also have a lengthwise direction substantially perpendicular to the lengthwise direction of semiconductor fins 130 and 230. Although not shown in FIG. 6, gate spacers 137 and 237 (FIG. 7) are also formed on the sidewalls of dummy gate stacks 132 and 232.

Figure 7:
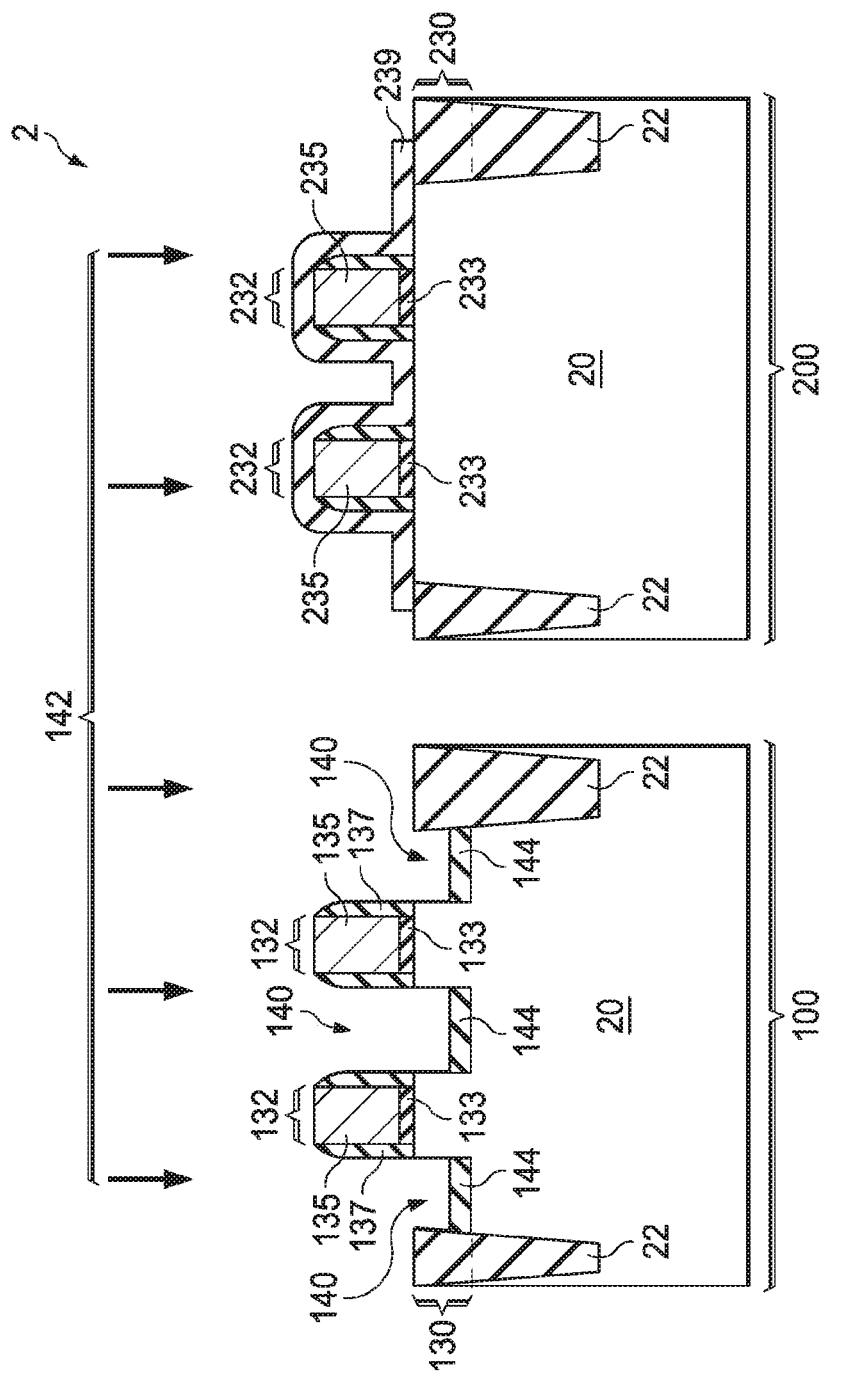

FIGS. 7 through 12 illustrate the cross-sectional views in the formation of source and drain regions and dislocation planes in regions 100 and 200. The cross-sectional views are obtained from the planes crossing lines A-A in FIG. 6. Referring to FIG. 7, implant blocking layer 239 is formed to cover the structures in region 200, while the structures in region 100 are not covered. Next, the portion of substrate 20 in region 100 is recessed, forming recesses 140. In some embodiments, the recessing is anisotropic, so that the sidewalls of recesses 140 are substantially vertical, and are aligned to the sidewalls of gate spacers 137, although recesses 140 may also extend underlying gate spacers 137. Although recesses 140 are illustrated as having rectangular cross-sectional shapes, they may also have other shapes such as spade-shapes. In the recessing of substrate 20 in region 100, the portions of substrate 20 in region 200 are protected by implant blocking layer 239.

Next, an amorphization implantation 142 is performed, forming amorphized regions 144, which are portions of the substrate 20 under recesses 140. In some embodiments, the amorphization implantation 142 is performed by implanting substrate 20 with species such as germanium, silicon, or the like. As a result of amorphization implantation 142, as shown in FIG. 7, amorphized regions 144 are formed, which may include amorphized silicon in some embodiments. The portions of substrate 20 in region 200 are protected from the implantation by implant blocking layer 139, and remain to have a crystalline structure.

Figure 8:
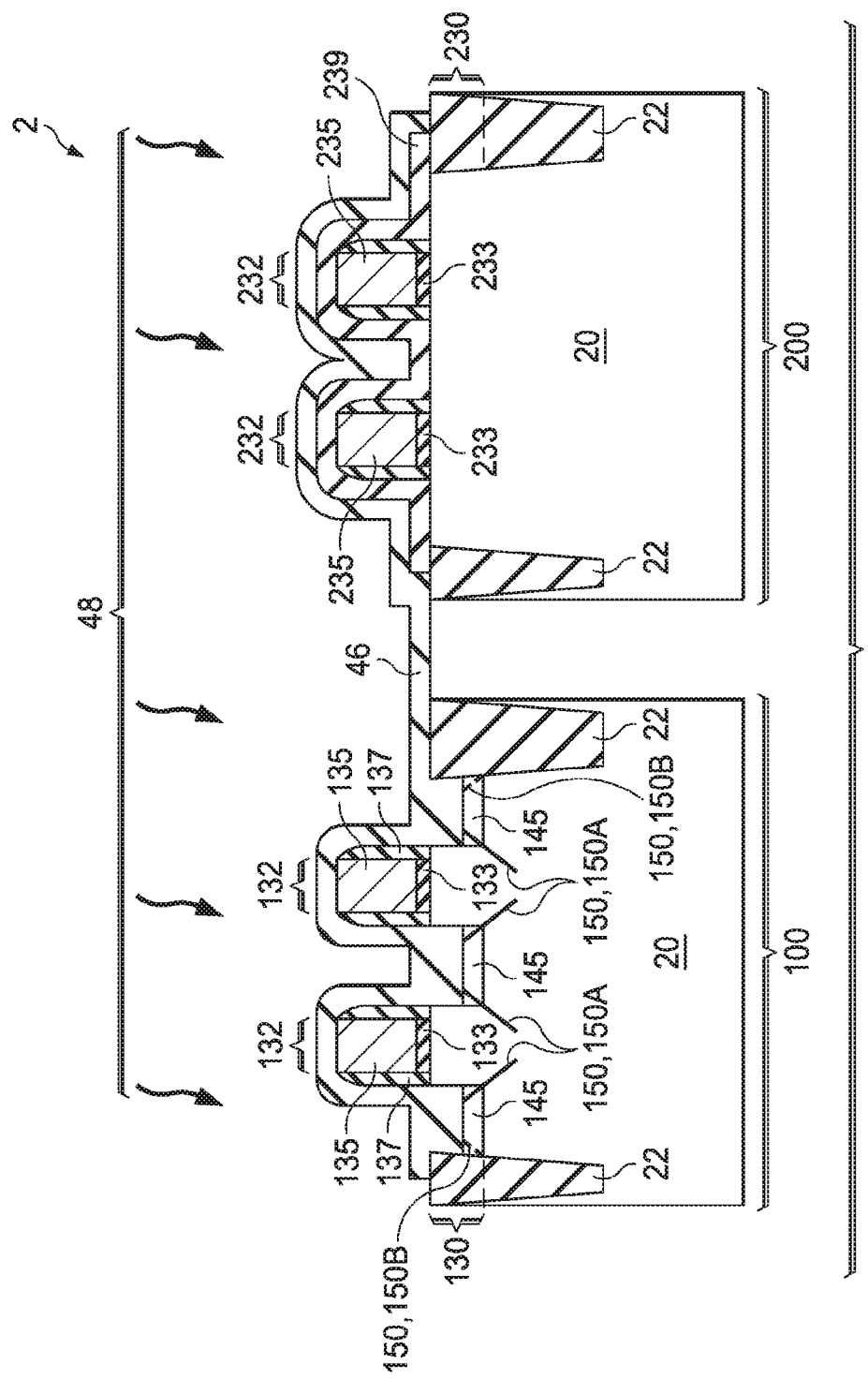

Next, as shown in FIG. 8, strained capping layer 46 is formed on the structure shown in FIG. 7. Strained capping layer 46 is formed in device region 100, and may, or may not, extend into region 200. The materials of strained capping layer 46 may include silicon nitride, titanium nitride, oxynitride, oxide, SiGe, SiC, SiON, and/or combinations thereof. Strained capping layer 46 may have an inherent tensile stress. The formation process of strained capping layer 46 is adjusted to tune the stress of strained capping layer 46 to a desirable value.

An annealing (represented by arrows 48) is then performed to form dislocation planes 150 in amorphized regions 144 (FIG. 7). The annealing may be performed using Rapid Thermal Anneal (RTA), laser anneal, or other anneal methods. In some embodiments, the annealing is performed using spike RTA, with the annealing temperature between about 900° C. and about 1100° C., for example. As a result of the annealing, amorphized regions 144 as in FIG. 7 are recrystallized to form crystalline regions 145, with a memorized stress obtained from strained capping layer 46.

As the result of the annealing, dislocation planes 150 are also formed in crystalline regions 145. Although illustrated as lines in the cross-sectional view as shown in FIG. 8, dislocation planes 150 are planes that extend parallel to the longitudinal direction of dummy electrode 135. In the crystalline regions 145 that are between two dummy gate electrodes 135, there may be two dislocation planes 150 tilting in opposite directions. In a crystalline region 146 that is formed between a dummy gate electrode 135 and a neighboring STI 22, there may be a single dislocation plane 150 (marked as 150A) formed. The other dislocation plane 150B may be formed, or may not be formed if the width of the crystalline regions 145 is not great enough. Furthermore, in region 200, no dislocation plane is formed.

Figure 9:
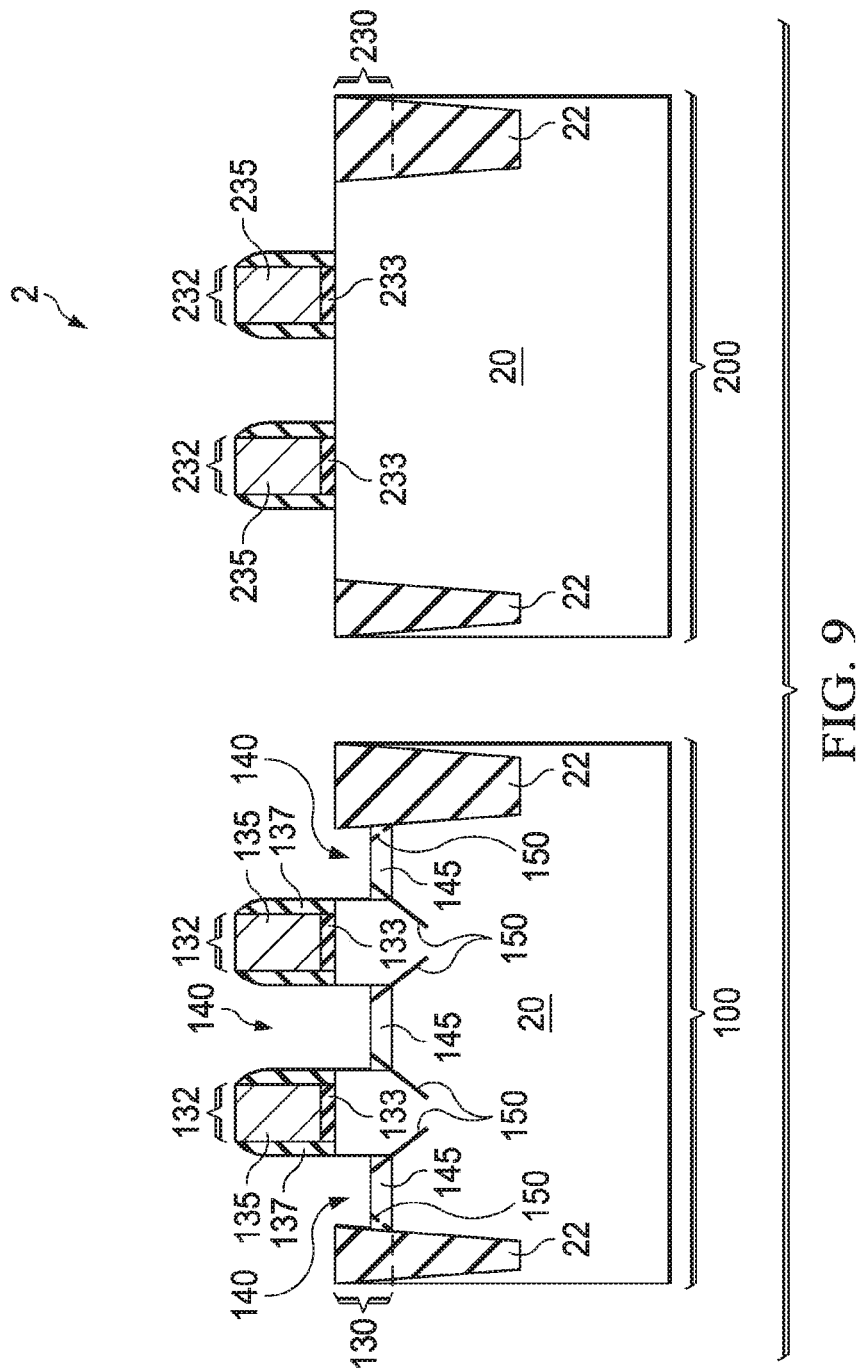
Figure 10:
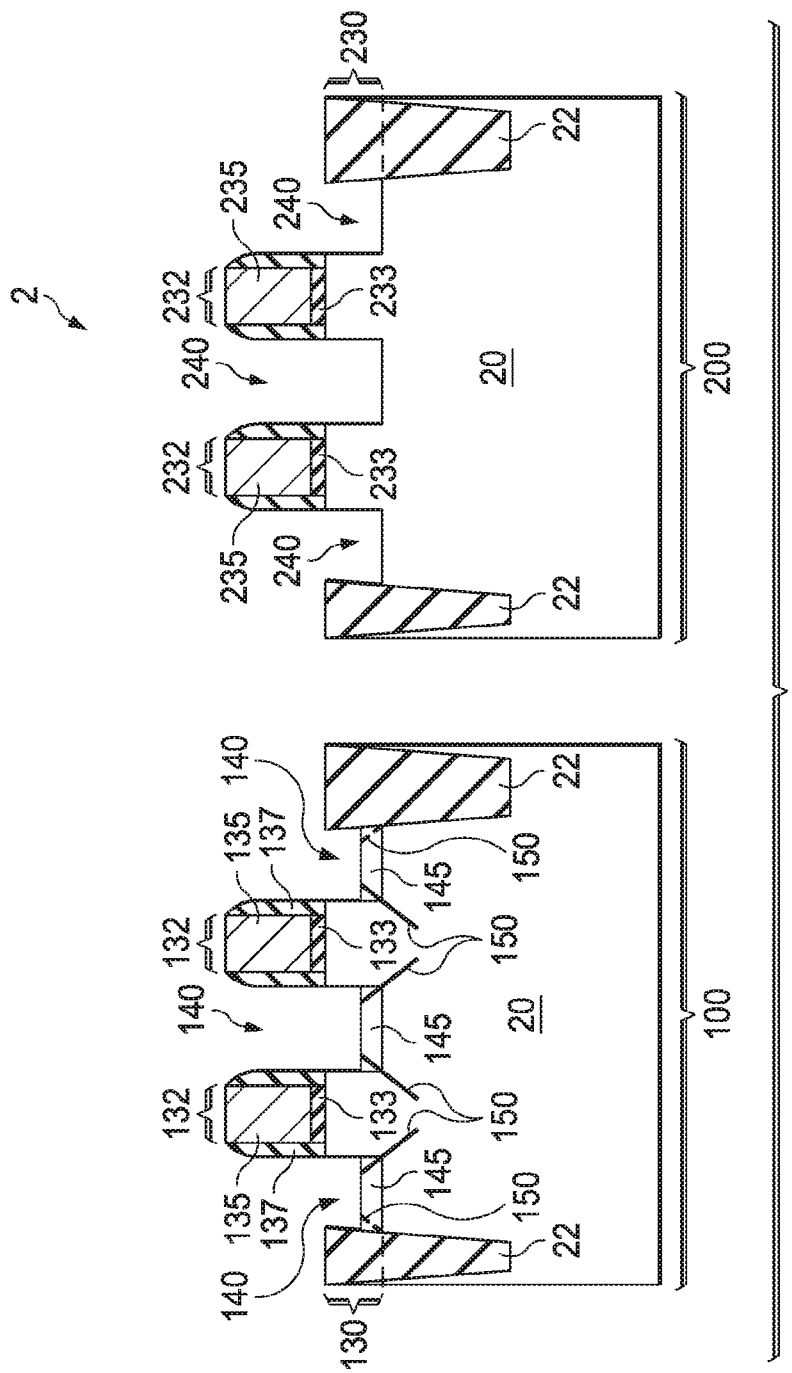
Figure 11:
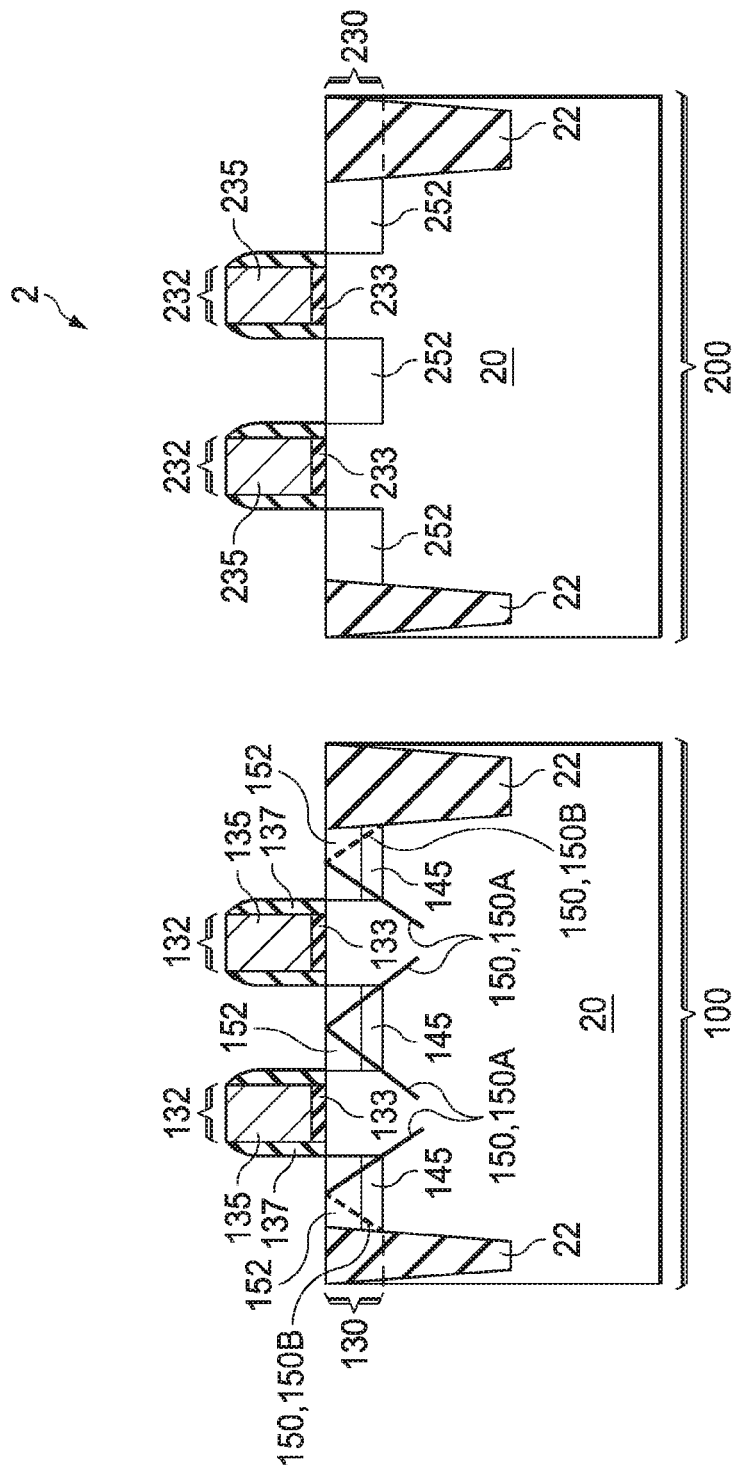
Figure 21B:
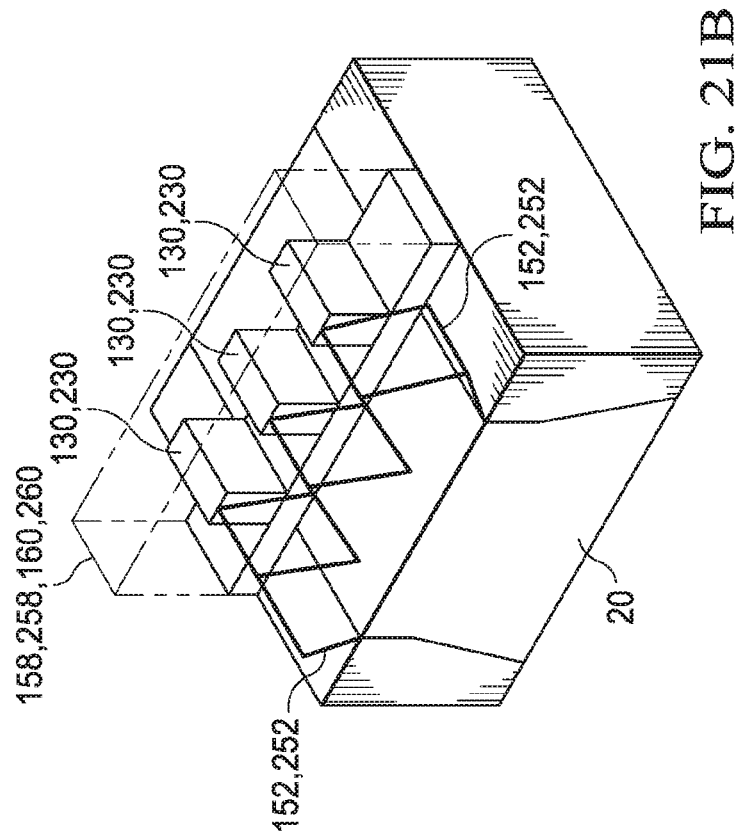
FIGS. 21A and 21B illustrate the top view and the perspective view of a multi-fin FinFET with some alternative exemplary embodiments.
Figure 21A:
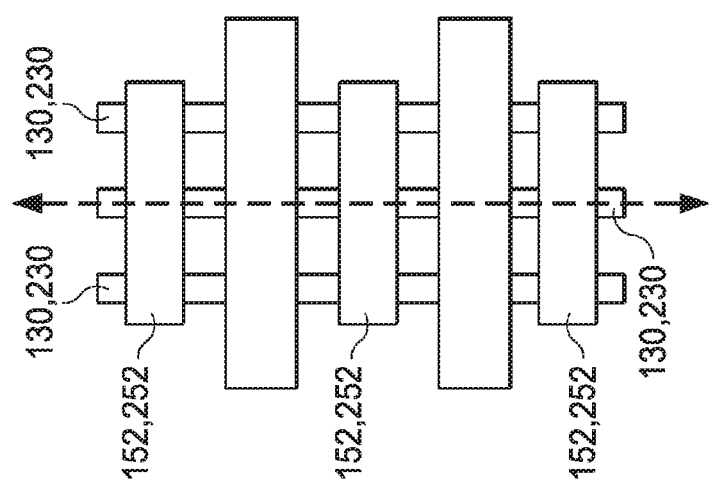

Next, implant blocking layer 139 and strained layer 46 are removed, and the resulting structure is shown in FIG. 9. In a subsequent step, referring to FIG. 10, recesses 240 are formed in region 200. In the formation of recesses 240, the structure in region 100 may be protected by a mask layer (not shown), which is removed after the formation of recesses 240. In a subsequent step, a shown in FIG. 11, source and drain regions (denoted as source/drain regions hereinafter) 152 and 252 are formed through epitaxy. The top view and the perspective view of source and drain regions 152/252 are shown in FIGS. 21A and 21B, respectively. As shown in FIG. 11, the source/drain regions 152/252 between neighboring gate stacks 132 are common sources or common drains. Furthermore, as shown in FIG. 21B, the neighboring source regions may merge with each other, and the neighboring drain regions may merge with each other. During the epitaxy, SiP, SiC, SiPC, silicon, or the like may be epitaxially grown. Furthermore, an n-type impurity such as phosphorous, arsenic, or the like, may also be in-situ doped with the proceeding of the epitaxy for forming n-type FinFETs. In the embodiments the devices in region 200 comprise a p-type FinFET, a p-type impurity such as boron may be in-situ doped. In these embodiments, however, the epitaxy regions in regions 100 and 200 are formed separately.

Figure 12:
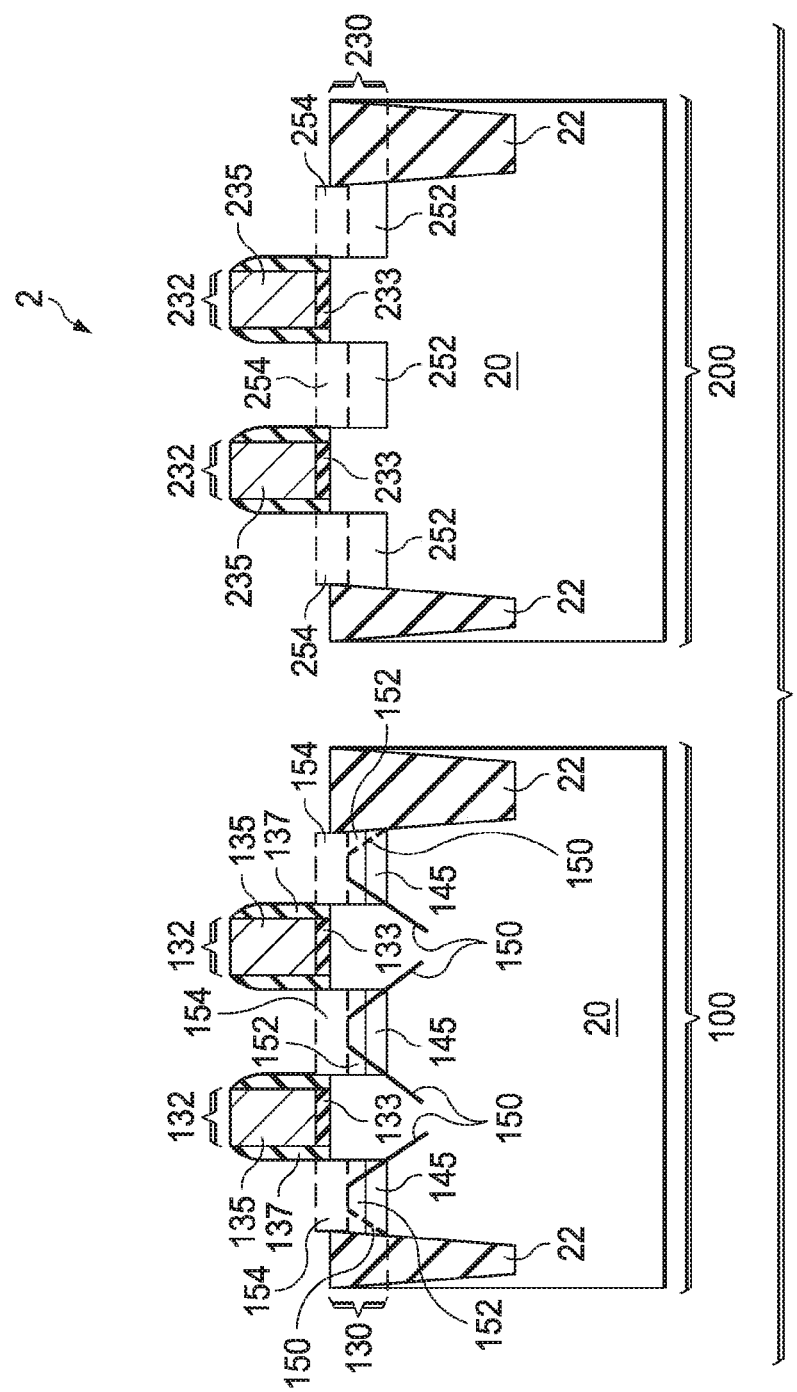

During the epitaxy, dislocation planes 150 also grow with the proceeding of the epitaxy, and hence dislocation planes 150 are also formed in source/drain regions 152. On the other hand, no dislocation plane is grown in source/drain regions 252. FIG. 12 illustrates the formation of source/drain silicides regions 154 and 254.

FIG. 13 illustrates a perspective view of the structure after Inter-Layer Dielectric (ILD) 56 is formed. ILD 56 comprises a dielectric material such as Phospho-Silicate Glass (PSG), Boro-Silicate Glass (BSG), Boron-Doped Phospho-Silicate Glass (BPS G), or the like. A CMP may be performed to level the top surface of ILD 56 with the top surface of dummy gate stacks 132 and 232. Accordingly, source/drain regions 152 and 252 are buried under ILD 56. Although not shown, before the formation of ILD 56, spacers may be formed on the opposite sidewalls of dummy gate stacks 132 and 232, wherein the spacers may be formed of a material different from the materials of ILD 56 and dummy gate stacks 132 and 232.

Figure 14:
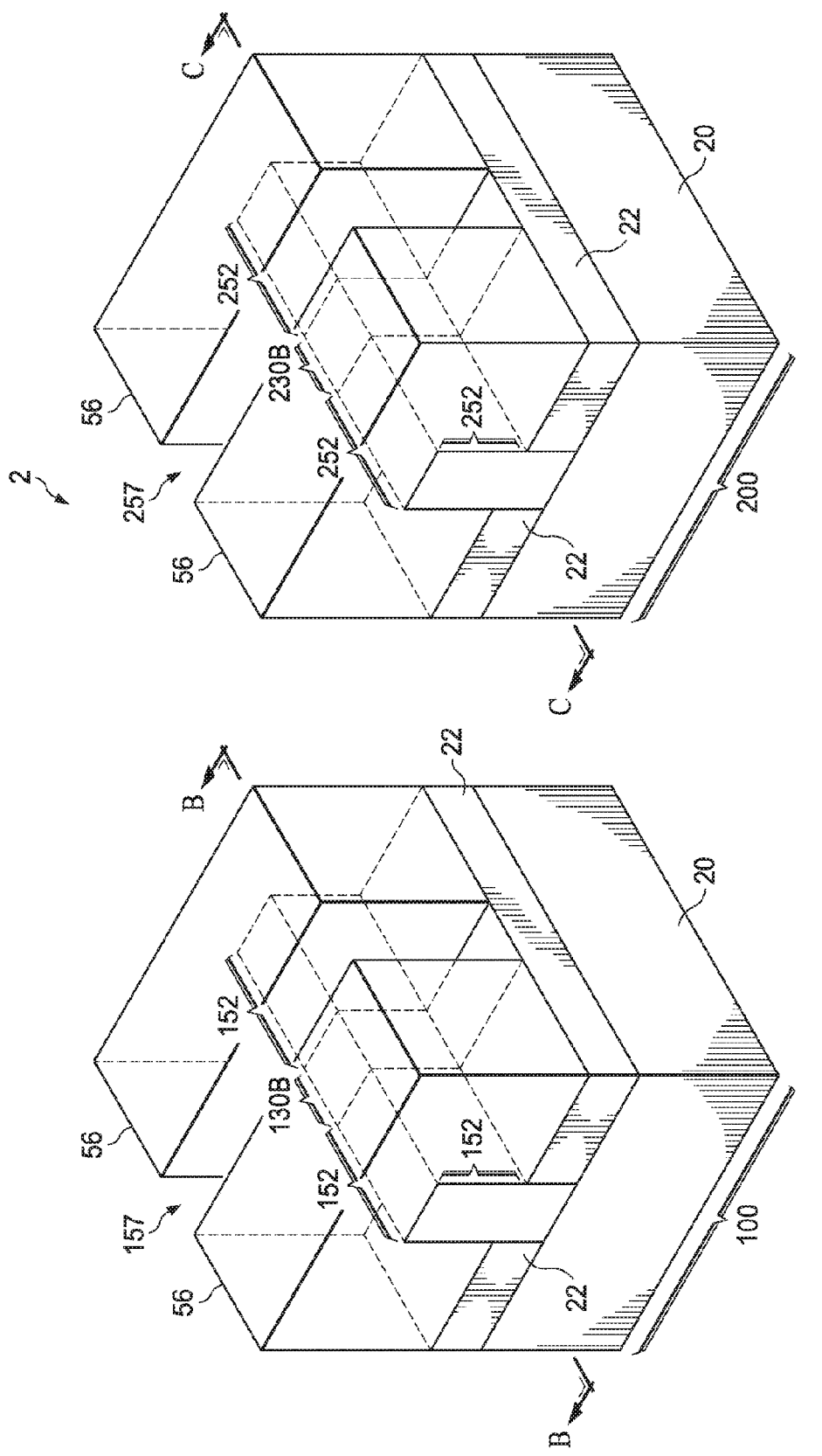
Figure 15:
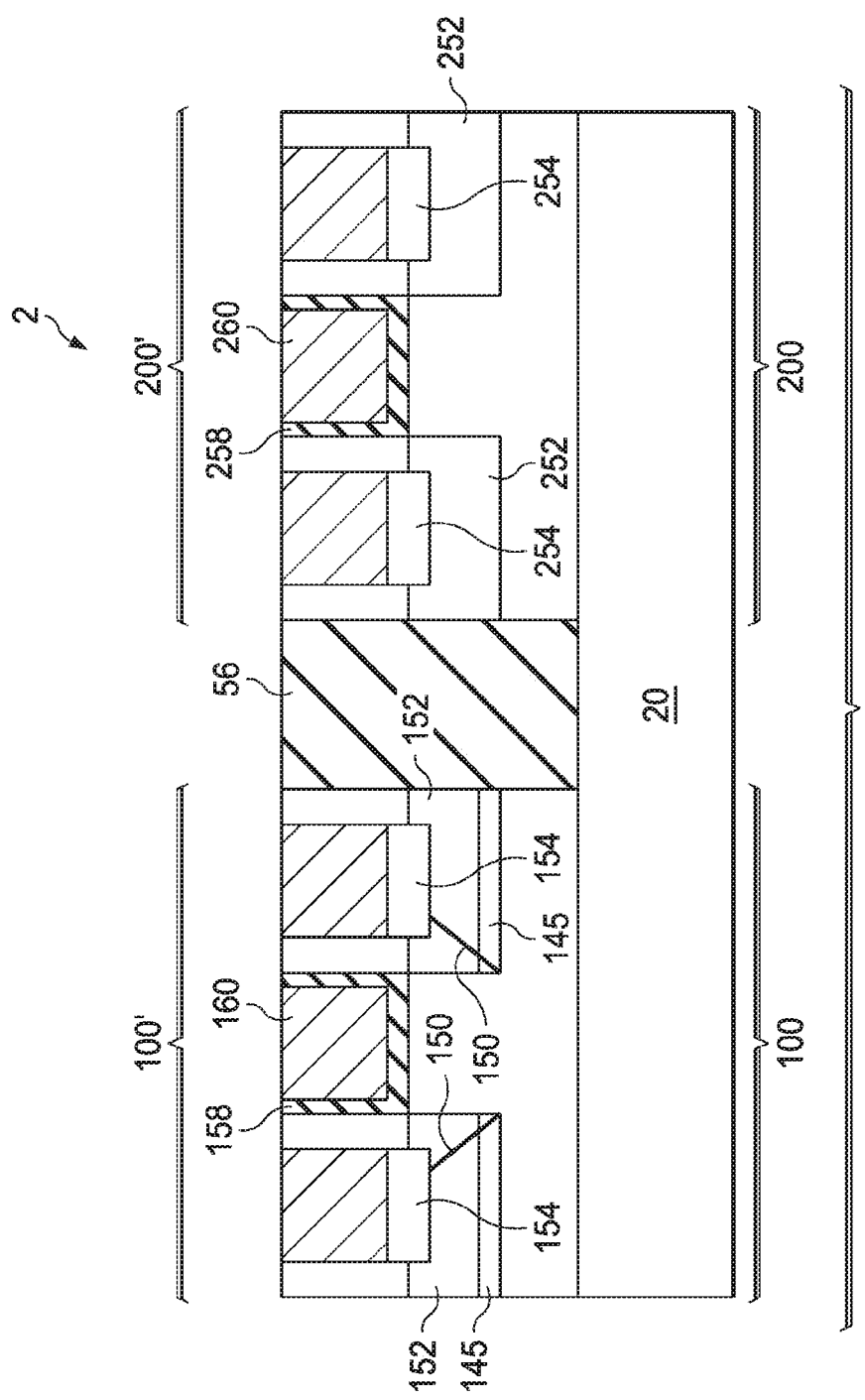

Next, dummy gate stacks 132 and 232 are removed in an etching step, so that trenches 157 and 257 are formed in ILD 56. The resulting structure is shown in FIG. 14. Trenches 157 and 257 are located in regions 100 and 200, respectively. Replacement gates are then formed, as shown in FIG. 15, which illustrates cross-sectional views of regions 100 and 200. The Cross-sectional views in FIG. 15 are retrieved from the same planes that cross lines B-B and C-C in FIG. 14. The replacement gates include gate dielectrics 158 and 258 and gate electrodes 160 and 260.

The intermediate stages in the formation of gate dielectrics 158 and 258 and gate electrodes 160 and 260 are not illustrated, and are described briefly below. In the formation process, a gate dielectric layer (not shown) is formed as a blanket layer in trenches 157 and 257 (FIG. 14) and on the top surfaces and the sidewalls of semiconductor fin portions 130B and 230B and ILD 56. In accordance with some embodiments, the gate dielectric layer comprises silicon oxide, silicon nitride, or multilayers thereof. In alternative embodiments, the gate dielectric layer comprises a high-k dielectric material. In which embodiments, the gate dielectric layer may have a k value greater than about 7.0, and may include a metal oxide of Hf, Al, Zr, La, Mg, Ba, Ti, Pb, and combinations thereof. Next, a conductive material (not shown) is deposited over the gate dielectric layer, and fills the remaining trenches 157 and 257 (FIG. 14). The conductive material may comprise a metal-containing material such as TiN, TaN, TaC, Co, Ru, Al, combinations thereof, or multi-layers thereof. After the deposition of the conductive material, a CMP is performed to remove the excess portions of the gate dielectric layer and the conductive material, which excess portions are over the top surface of ILD 56. The resulting remaining portions of the conductive material and the gate dielectric layer thus form the replacement gates of the resulting FinFETs 100' and 200' in regions 100 and 200, respectively.

Figure 16:
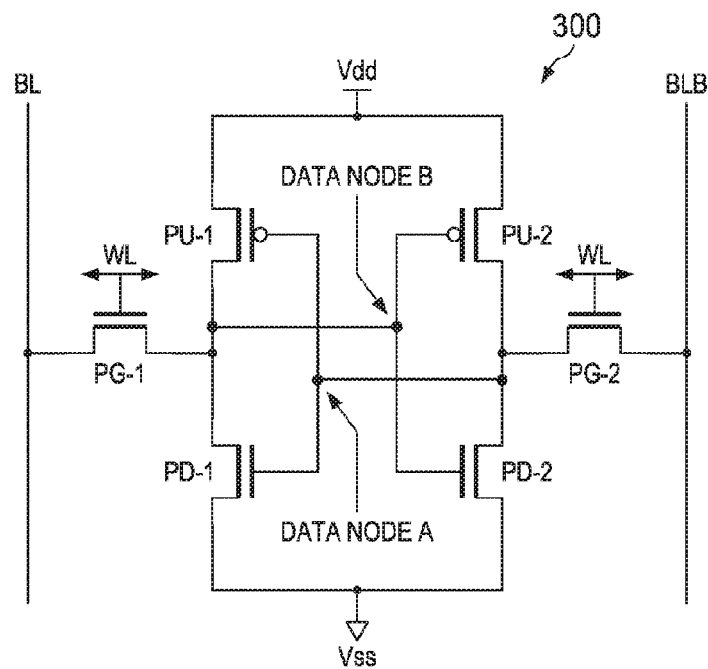
FIG. 16 illustrates a circuit diagram of a Static Random Access Memory (SRAM) cell in accordance with exemplary embodiments.

FIG. 16 illustrates a circuit diagram of SRAM cell 300 in accordance with some embodiments. SRAM cell 300 includes pass-gate transistors PG-1 and PG-2 and pull-down transistors PD-1 and PD-2, which are N-type Metal-Oxide-Semiconductor (NMOS) transistors. SRAM cell 300 further includes pull-up transistors PU-1 and PU-2, which are P-type Metal-Oxide-Semiconductor (PMOS) transistors, The gates of pass-gate transistors PG-1 and PG-2 are connected to word-line WL that determines whether SRAM cell 300 is selected or not. A latch formed of pull-up transistors PU-1 and PU-2 and pull-down transistors PD-1 and PD-2 stores a bit, wherein the complementary values of the bit are stored in data node A and data node B. The stored bit can be written into, or read from, SRAM cell 300 through bit lines BL and BLB.

The sources of pull-up transistors PU-1 and PU-2 are connected to voltage node Vdd, which carries positive power supply voltage (and line) Vdd. The sources of pull-down transistors PD-1 and PD-2 are connected to power supply node Vss, which are further connected to power supply voltage/line Vss (an electrical ground, for example). The gates of transistors PU-1 and PD-1 are connected to the drains of transistors PU-2 and PD-2, which connection node is data node A. The gates of transistors PU-2 and PD-2 are connected to the drains of transistors PU-1 and PD-1, which connection node is data node B. A source or drain region (referred to as source/drain region hereinafter) of pass-gate transistor PG-1 is connected to bit-line BL. A source/drain region of pass-gate transistor PG-2 is connected to bit-line BLB.

In some embodiments, transistors PD-1 and PD-2 and/or transistors PG-1 and PG-2 are formed using essentially the same process as for forming device 200' in region 200 (FIG. 15). Transistors PD-1 and PD-2 and/or transistors PG-1 and PG-2 thus do not have dislocation planes formed therein. Without the dislocation planes, the threshold voltages of transistors PD-1 and PD-2 and/or transistors PG-1 and PG-2 are high than if dislocation planes are formed. With higher threshold voltages, the states of SRAM cell 300 are more stable. On the other hand, in the same chip and on the same substrate 20, a device 100' (FIG. 15) is also formed. Device 100', with the dislocation planes, has a lower threshold voltage and hence a higher on-current than device 200', and can be used as, for example, a logic device due to its higher performance. Hence, the present disclosure provides a multi-Vt solution for forming transistors having different threshold voltages to suit to different requirements.

Figure 17:
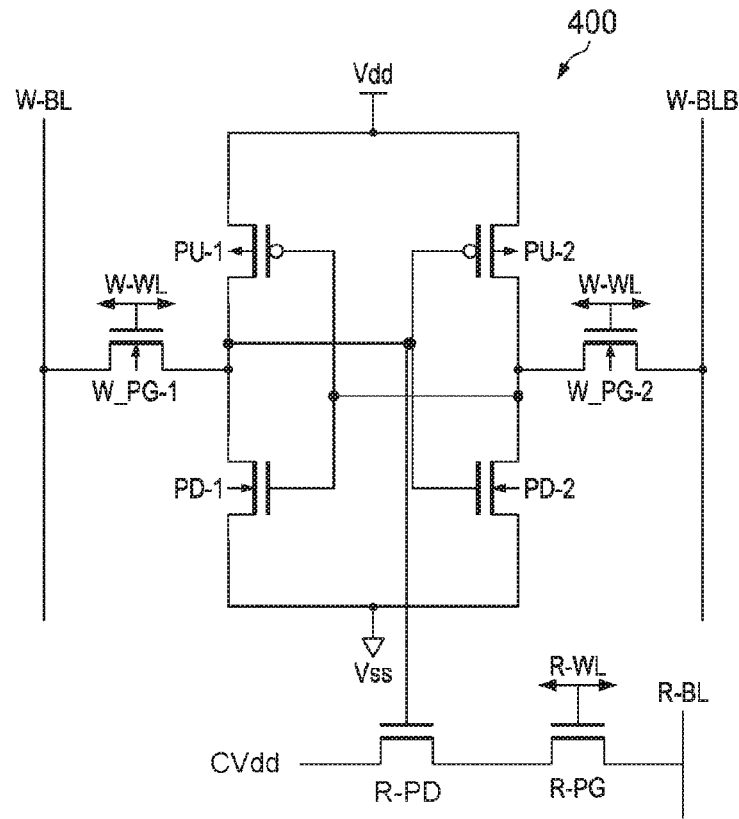
FIG. 17 is a circuit diagram of a two-port SRAM cell in accordance with exemplary embodiments.

FIG. 17 illustrates a circuit diagram of two-port SRAM cell 400, which includes a write port and a read port. The write port includes transistors PU-1 and PD-1, and FinFETs PU-2 and PD-2. The write port further includes pass-gate transistors W_PG-1 and W_PG-2, wherein the gates of transistors W_PG-1 and W_PG-2 are coupled to write word-line W-WL. The writing of SRAM cell 400 is through complementary write bit-lines W-BL and W-BLB. The read port includes transistors PU-1 and PD-1, transistors PU-2 and PD-2, pull-down transistor R-PD, and pass-gate transistor R-PG. The data retrieved from SRAM cell is sent to read bit-line R-BL. Transistors R-PD is further coupled to positive power supply CVdd. Transistors R-PD and R-PG are cascaded. The gate of transistor RPG may be coupled to read word-line R-WL.

In some embodiments, transistors PD-1 and PD-2 (and possibly W_PG-1 and W_PG-2) are formed in device region 200 (FIG. 15) and having the structures of device 200'. Therefore, they have high threshold voltages, and hence SRAM cell 400 is highly stable. Transistors R-PD and RPG, on the other hand, do not have the stability concern. Hence, they are formed in device region 100 (FIG. 15) and have the structures of device 100', so that they can have lower threshold voltages and higher on-currents. The read speed of the read port is hence improved without sacrificing the stability of SRAM cell 400. Therefore, the present disclosure provides a solution of incorporating multi-threshold voltage devices in a same SRAM cell without increasing the manufacturing cost.

Figure 18:
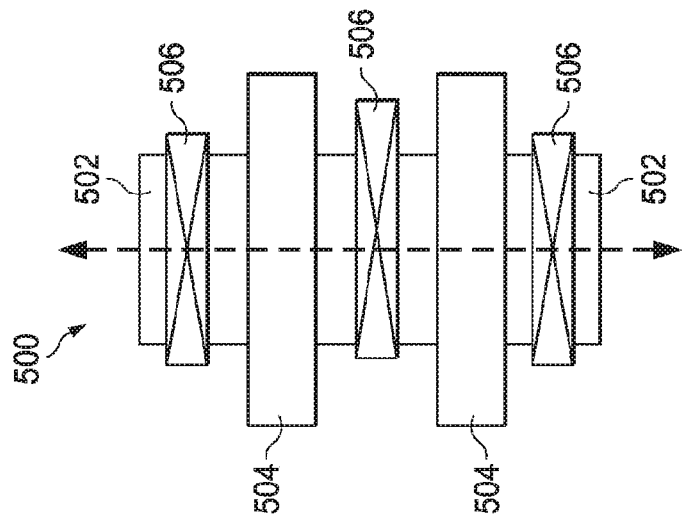
FIG. 18 illustrates a layout of a planar transistor in accordance with some alternative exemplary embodiments.

FIG. 18 illustrates a layout of a planar transistor 500, which includes active region 502, gate electrodes 504, and source/drain contacts 506. In accordance with some embodiments, the structure of the planar device in FIG. 18 may be used to form a first planar transistor having dislocation planes, and a second planar transistor without dislocation planes, with the first and the second planar transistors being on the same substrate and in the same chip. The planar devices may also be used for forming the SRAM cell device and the logic device. For example, the NMOS transistors PD-1 and PD-2 in SRAM cell 300 may be formed using the planar transistor that do not have dislocation planes, while a logic transistor (or any other transistor requiring a higher on-current) may be formed using the planar transistor that has dislocation planes.

Figure 19:
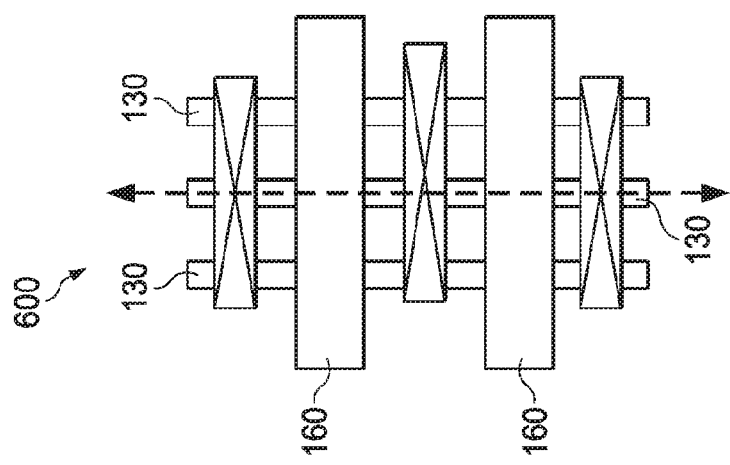
FIG. 19 illustrates a layout of a multi-fin FinFET in accordance with some alternative exemplary embodiments.
Figure 20:
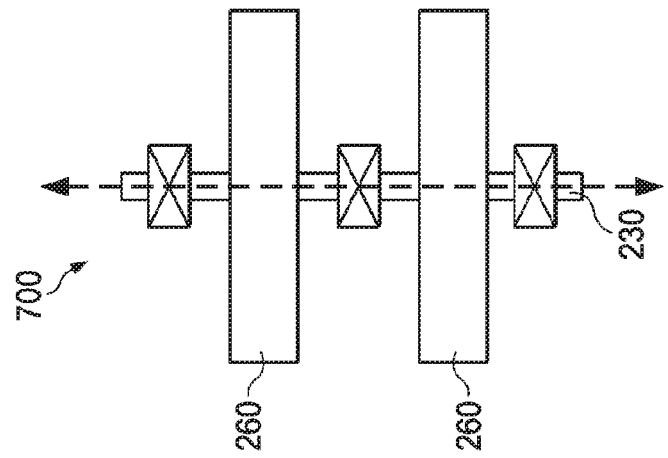
FIG. 20 illustrates a layout of a single-fin FinFET in accordance with some alternative exemplary embodiments.
Figure 22:
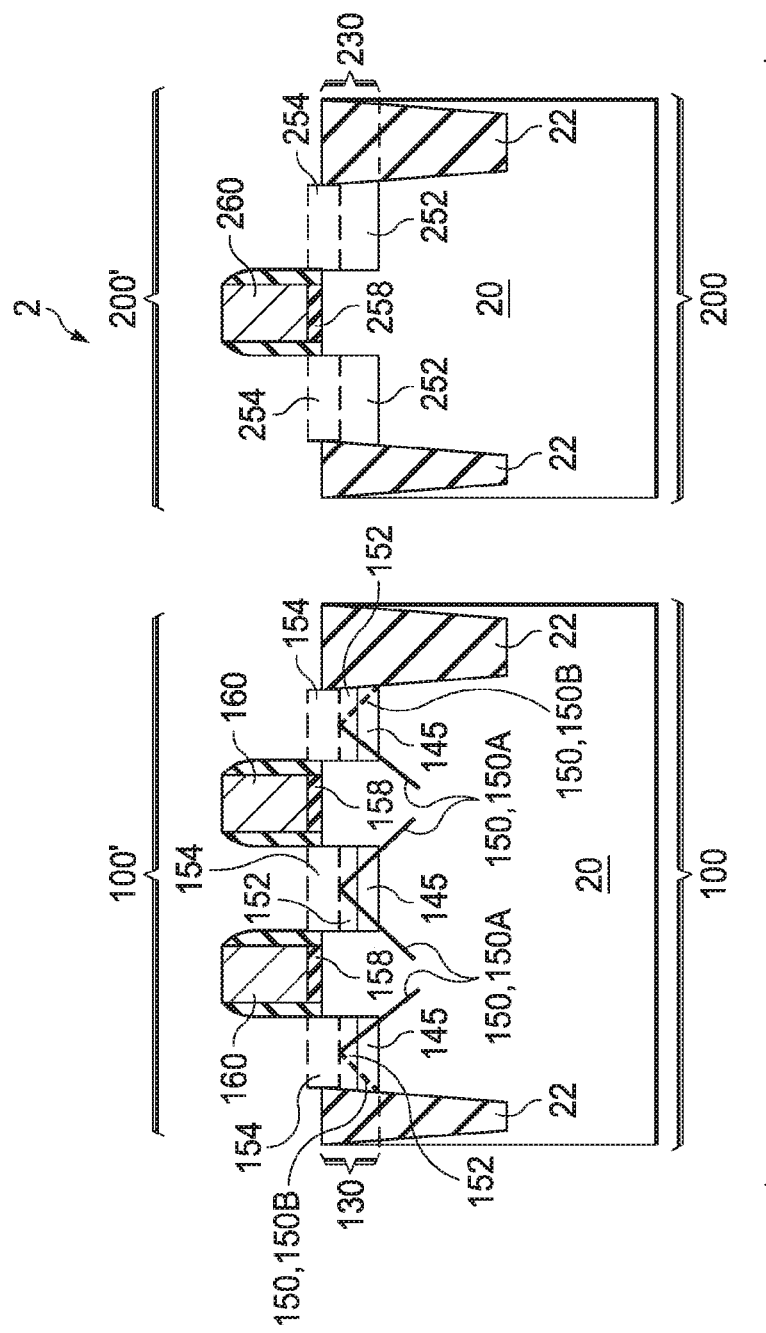
FIG. 22 illustrates the cross-sectional view of a multi-fin FinFET with dislocation planes and a single-fin FinFET without dislocation planes in accordance with some exemplary embodiments.

FIGS. 19 and 20 illustrate the layout of a multi-fin FinFET 600 and a single-fin FinFET 700, respectively. In FIG. 19, a plurality of semiconductor fins 130 (also refer to FIG. 5) are formed, and gate electrodes 160 are formed over semiconductor fins 130. In FIG. 20, a single semiconductor fin 230 (also refer to FIG. 5) is formed, and gate electrodes 260 are formed over semiconductor fin 230. The cross-sectional views of multi-fin FinFET 600 and single-Fin FinFET 700 are illustrated in FIG. 22. In these embodiments, multi-fin FinFET 600 has dislocation planes 150, while single-fin FinFET 700 does not have dislocation planes 150 formed therein. Accordingly, in some exemplary embodiments, multi-fin FinFET 600, due to the multiple fins and lower threshold voltage caused by not forming the dislocation planes, has a very high on-current, and can be used as, for example, logic device 100' in FIG. 22. On the other hand, single-fin FinFET 700 has a high threshold voltage, and can act as devices PD-1 and PD-2 (and/or PG-1 and PG-2) (FIG. 16) in SRAM cell 400. Alternatively, the single-fin FinFET 700 that have no dislocation planes may form the write-port devices PD-1 and PD-2 (and/or W_PG-1 and W_PG-2) in a two-port SRAM cell (FIG. 17), while the multi-fin FinFETs 600 that have dislocation planes may form the read-port devices R-PD and R-PG. The formation of the structure in FIG. 22 is essentially the same as in FIGS. 1 through 15.

Figure 23:
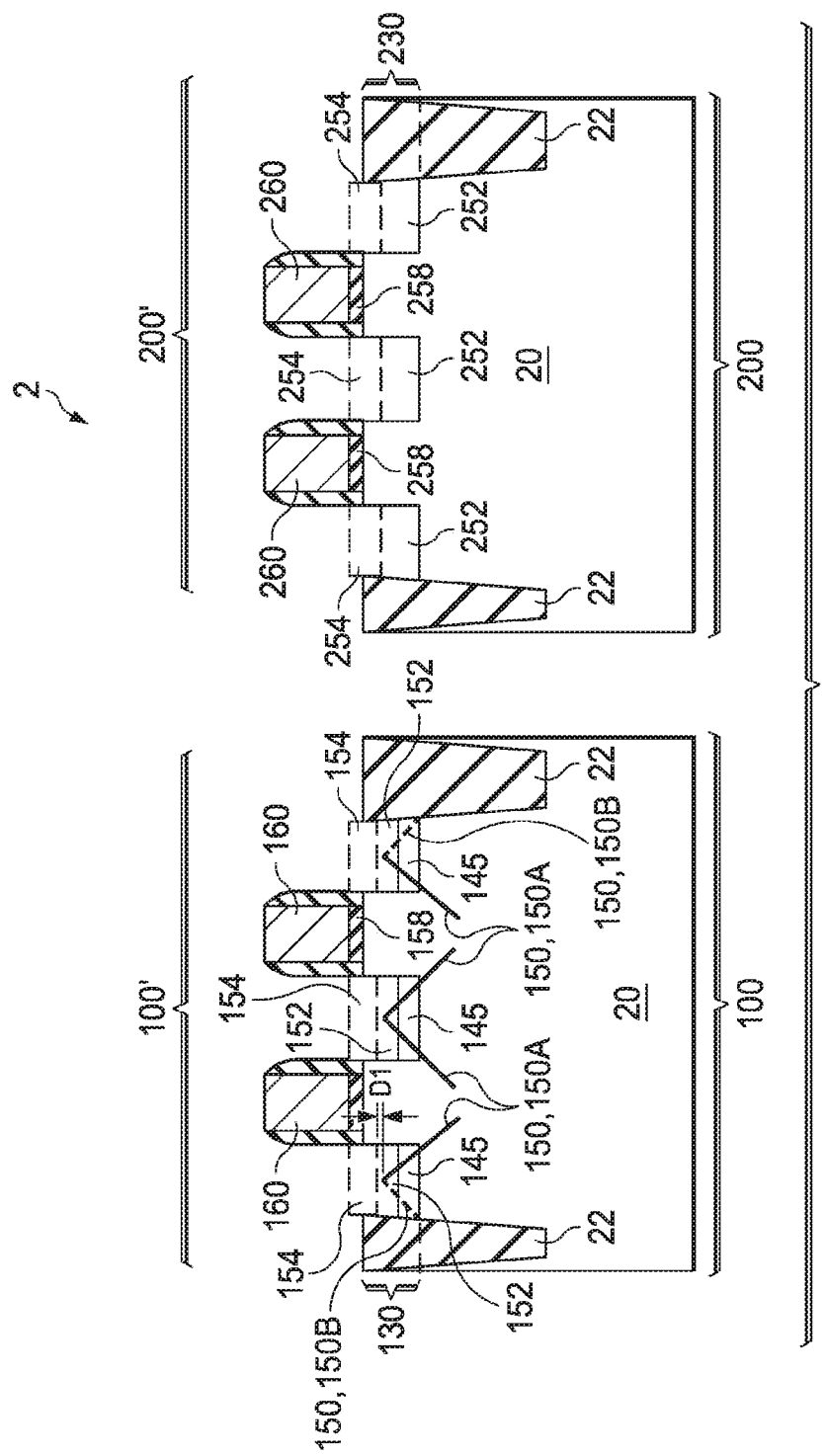
FIG. 23 illustrates the cross-sectional view of a first FinFET with dislocation planes and a second FinFET without dislocation planes in accordance with some exemplary embodiments, wherein the top ends of the dislocation planes in the first FinFET is lower than the respective silicide regions.

FIG. 23 illustrates a structure in accordance with alternative embodiments. These embodiments are similar to the embodiments in FIG. 15, except that dislocation planes 150 tilting in different directions met with each other, and end at a point lower than the bottom surface of silicide regions 154. Distance D1 between the end point of dislocation planes 150 and the bottom surface of silicide regions 154 may be between about 3 nm and about 10 nm, for example.

In the embodiments of the present disclosure, transistors having different threshold voltages are formed by forming dislocation planes selectively, and/or by selecting the number of fins. The difference between the threshold voltages of the devices that have or don't have dislocation planes may be greater than about 40 mV, and may be between about 40 mV and about 100 mV. The requirement of different circuits may thus be met without significantly increasing manufacturing cost.

In accordance with some embodiments, a chip includes a semiconductor substrate, and a first NMOSFET at a surface of the semiconductor substrate. The first NMOSFET includes a gate stack over the semiconductor substrate, a source/drain region adjacent to the gate stack, and a dislocation plane having a portion in the source/drain region. The chip further includes a second NMOSFET at the surface of the semiconductor substrate, wherein the second NMOSFET is free from dislocation planes.

In accordance with other embodiments, a chip includes a multi-fin n-type FinFET and a single-fin n-type FinFET. The multi-fin n-type FinFET includes a plurality of semiconductor fins, a first gate stack on sidewalls and top surfaces of the plurality of semiconductor fins, a first source/drain region adjacent to the first gate stack, and a dislocation plane having a portion in the first source/drain region. The single-fin n-type FinFET includes a single semiconductor fin, a second gate stack on a sidewall and a top surface of the single semiconductor fin, and a second source/drain region adjacent to the first gate stack, wherein no dislocation plane extends into the second source/drain region.

In accordance with yet other embodiments, a method includes forming a first gate stack in a first device region and a second gate stack in a second device region, and forming an implant blocking layer to cover the second device region, wherein the first device region is not covered by the implant blocking layer. The method further includes recessing a portion of a semiconductor region in the first device region to form a recess, and performing an amorphization implantation to form an amorphized region under the recess, wherein no amorphized region is formed in the second device region. A strained capping layer is then formed over the first gate stack and the amorphized region, followed by an annealing to re-crystalize the amorphized region to form a re-crystallized region, wherein a dislocation plane is formed in the re-crystallized region. The method further includes removing the strained capping layer and the implant blocking layer, epitaxially growing a first source/drain region in the recess, and forming a second source/drain region in the second device region and adjacent to the second gate stack.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a first gate stack in a first device region and a second gate stack in a second device region;
    forming an implant blocking layer to cover the second device region, wherein the first device region is not covered by the implant blocking layer;
    recessing a portion of a semiconductor region in the first device region to form a recess;
    performing an amorphization implantation to form an amorphized region under the recess, wherein no amorphized region is formed in the second device region;
    forming a strained capping layer over the first gate stack and the amorphized region;
    performing an annealing to re-crystalize the amorphized region to form a re-crystallized region, wherein a first dislocation plane is formed in the re-crystallized region;
    removing the strained capping layer and the implant blocking layer;
    epitaxially growing a first source/drain region in the recess; and
    forming a second source/drain region in the second device region and adjacent to the second gate stack, wherein the first source/drain region is a part of a multi-fin Fin Field Effect Transistor (FinFET), and wherein the second source/drain region is a part of a single-fin FinFET.

2. The method of claim 1 further comprising:
    after the first source/drain region and the second source/drain region are formed, forming an Inter-Layer Dielectric (ILD) over the first gate stack and the second gate stack and the first source/drain region and the second source/drain region;
    removing the first gate stack and the second gate stack to form a first trench and a second trench; and
    forming a first replacement gate and a second replacement gate in the first trench and the second trench, respectively.

3. The method of claim 1, wherein the first source/drain region is a part of a logic N-type Metal Oxide Semiconductor Field Effect Transistor (NMOSFET) in a logic device region, and wherein the second source/drain region is a part of an NMOSFET in a Static Random Access Memory (SRAM) cell.

4. The method of claim 1, wherein the first source/drain region is a part of an NMOSFET comprised in a read port of a two-port SRAM cell, and wherein the second source/drain region is a part of an NMOSFET comprised in a write port of the two-port SRAM cell.

5. The method of claim 1, wherein the multi-fin FinFET is selected from a read-port pull-down transistor, a read-port pass-gate transistor, and combinations thereof, of a two-port SRAM cell, and wherein the single-fin FinFET is a pull-down transistor of a write port of the two-port SRAM cell.

6. The method of claim 1, wherein the first source/drain region is a part of a planar NMOSFET, and wherein the second source/drain region is a part of a planar NMOSFET.

7. The method of claim 1, wherein the second source/drain region is free from dislocation planes.

8. The method of claim 1, wherein the first source/drain region is a part of a first NMOSFET having a first threshold voltage, and wherein the second source/drain region is a part of a second NMOSFET having a second threshold voltage greater than the first threshold voltage, with a difference between the second threshold voltage and the first threshold voltage being greater than about 40 mV.

9. The method of claim 1 further comprising:
    after the performing of the annealing, a second dislocation plane is formed in the re-crystallized region, the first dislocation plane having a first portion in the first source/drain region and a second portion in semiconductor substrate, the second dislocation plane having a portion in the first source/drain region, the first dislocation plane and the second dislocation plane tilting in opposing directions.

10. A method comprising:
    forming a first fin extending above a substrate in a first device region and a second fin extending above the substrate in a second device region;
    forming a first gate stack over the first fin and a second gate stack over the second fin;
    recessing a portion of the first fin to form a first recess adjacent the first gate stack;
    amorphizing a portion of the first fin to form an amorphized region under the first recess;
    forming a strained capping layer over the first fin, first gate stack, the amorphized region, the second fin, and the second gate stack;
    annealing the amorphized region to form a re-crystallized region and a dislocation plane at least partially in the re-crystallized region;
    removing the strained capping layer;
    epitaxially growing a first source/drain region in the first recess;
    recessing a portion of the second fin to form a second recess adjacent the second gate stack; and
    epitaxially growing a second source/drain region in the second recess.

11. The method of claim 10, wherein amorphizing the portion of the first fin to form the amorphized region under the first recess comprises:
forming an implant blocking layer to cover the second fin, wherein the first fin is not covered by the implant blocking layer; and
performing an amorphization implantation to form the amorphized region under the first recess.

12. The method of claim 10, wherein no amorphized region is formed in the second fin.

13. The method of claim 10, wherein the first device region comprises a plurality of fins including the first fin, the plurality of fins, the first gate stack, and first source/drain region being parts of a multi-fin n-type Fin Field Effect Transistor (FinFET), and wherein the second fin, the second gate stack, and the second source/drain region are parts of a single-fin n-type FinFET.

14. The method of claim 13, wherein the multi-fin n-type FinFET is in a logic circuit, and wherein the single-fin n-type FinFET is in a Static Random Access Memory (SRAM) cell.

15. The method of claim 13, wherein the multi-fin n-type FinFET is comprised in a read port of a two-port SRAM cell, and wherein the single-fin n-type FinFET is comprised in a write port of the two-port SRAM cell.

16. The method of claim 13, wherein the multi-fin n-type FinFET is selected from a read-port pull-down transistor, a read-port pass-gate transistor, and combinations thereof, of a two-port SRAM cell, and wherein the single-fin n-type FinFET is a write-port pull-down transistor of the two-port SRAM cell.

17. The method of claim 10, wherein an entirety of the second fin is free from any dislocation plane.

18. A method comprising:
forming a shallow trench isolation region in a substrate;
forming a gate stack over the substrate;
recessing a portion of substrate to form a recess between the gate stack and the shallow trench isolation region;
performing an amorphization implantation to form an amorphized region under the recess;
forming a strained capping layer over the gate stack and the amorphized region;
performing an annealing to re-crystalize the amorphized region to form a re-crystallized region and a first dislocation plane and a second dislocation plane at least partially in the re-crystallized region;
removing the strained capping layer; and
epitaxially growing a first source/drain region in the recess, wherein after epitaxially growing the first source/drain region, the first dislocation plane extends from the substrate to the first source/drain region, and the second dislocation plane extends from the first source/drain region to the shallow trench isolation region, the first dislocation plane and the second dislocation plane being non-parallel to each other.

19. The method of claim 18, wherein the first source/drain region comprises silicon phosphorous.

20. The method of claim 19, wherein the first source/drain region further comprises carbon.

* * * * *